United States Patent [19]
Yokogawa et al.

[11] Patent Number: 5,956,362
[45] Date of Patent: Sep. 21, 1999

[54] SEMICONDUCTOR LIGHT EMITTING DEVICE AND METHOD OF ETCHING

[75] Inventors: Toshiya Yokogawa, Nara; Shigeo Yoshii, Nagaokakyo, both of Japan

[73] Assignee: Matsushita Electric Industrial Co., Ltd., Osaka, Japan

[21] Appl. No.: 08/806,929

[22] Filed: Feb. 26, 1997

[30] Foreign Application Priority Data

Feb. 27, 1996 [JP] Japan ...................................... 8-039445
Sep. 30, 1996 [JP] Japan ...................................... 8-258087

[51] Int. Cl.$^6$ ........................................................ H01S 3/19
[52] U.S. Cl. ................................................. 372/46; 372/96
[58] Field of Search .................................. 372/45, 46, 96; 257/83

[56] References Cited

U.S. PATENT DOCUMENTS

| | | | |
|---|---|---|---|
| 5,038,356 | 8/1991 | Botez et al. ............................... | 372/45 |
| 5,373,520 | 12/1994 | Shoji et al. ................................ | 372/45 |
| 5,488,233 | 1/1996 | Ishikawa et al. .......................... | 372/45 |
| 5,617,446 | 4/1997 | Ishibashi et al. .......................... | 372/45 |
| 5,657,336 | 8/1997 | Okuyama et al. ......................... | 372/45 |
| 5,679,964 | 10/1997 | Kobayashi et al. ........................ | 257/83 |
| 5,732,103 | 3/1998 | Ramdani et al. .......................... | 372/96 |
| 5,742,629 | 4/1998 | Nishikawa et al. ........................ | 372/46 |

FOREIGN PATENT DOCUMENTS 8-51248  2/1996  Japan .

OTHER PUBLICATIONS

Salokatve et al, "Low Voltage, Room Temperature, Ridge Waveguide Green–Blue Diode Laser", Electronics Letters, vol. 29, No. 23, pp. 2041–2042, Nov. 1993.

Nakayama et al, "Continuous–Wave Operation of 489.9 nm Blue Laser Diode at Room Temperature", Electronics Letters, vol. 29, No., 25, pp. 2194–2195, Dec. 1993.

Nakayama et al, "Continuous–Wave Operation of ZnMgSSe based Blue–Green Laser Diodes Under High Temperature and High Output Power", Electronics Letters, vol. 30, No. 7, pp. 568–570, Mar. 1994.

Jeon et al, "Optically Pumped Blue–Green Vertical Cavity Surface Emitting Lasers", Electronics Letters, vol. 31, No. 2, pp. 106–108, Jan. 1995.

Floyd et al., "Optically pumped CdZnSe/ZnSe blue–green vertical cavity surface emitting lasers", American Institute of Physics, Appl. Phys. Lett. 66 (22), May 29, 1995; pp. 2929–2931.

Yokogawa et al., "Electricially Pumped CdZnSe/ZnSe Blue–Green Vertical–Cavity Surface–Emitting Lasers", Jpn. J. Appl. Phys. vol. 34 (1995) pp. L751–L753, Part 2, No. 6B, Jun. 15, 1995.

Nikaido et al., "Fabrication of ZnSe Nanoscale Cylinders by Low–Biased $CH_4/H_2/O_2$–RIE" The Extended Abstracts of the Spring Convention of the Japanese Society of Applied Physics, 1995, p. 1313 (with partial English translation) (no month available).

Ohtsuka et al., "Electrical characterization of ZnSe epitaxial layer reactive–ion–etched by a gas mixture of ethane and hydrogen", American Institute of Physics, J. Appl. Phys. 75 (12), Jun. 15, 1994, pp. 8231–8233.

*Primary Examiner*—Rodney Bovernick
*Assistant Examiner*—Quyen Phan Leung
*Attorney, Agent, or Firm*—Ratnia & Prestia

[57] ABSTRACT

A vertical cavity type semiconductor light emitting device includes: a light emitting layer made of a II–IV group compound semiconductor material; a first II–VI group compound semiconductor layer which has an opening at a position corresponding to the inside of the light emitting layer; and an upper mirror and a lower mirror which are provided so as to interpose the light emitting layer therebetween. A current is injected through the opening into the light emitting layer.

32 Claims, 13 Drawing Sheets

FIG. 4A  Cl2/H2 dry etching
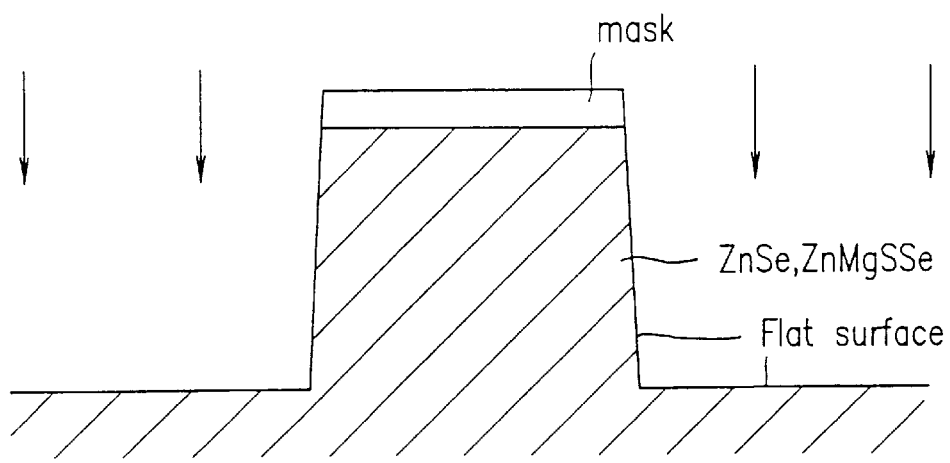
FIG. 4B  Cl2 dry etching
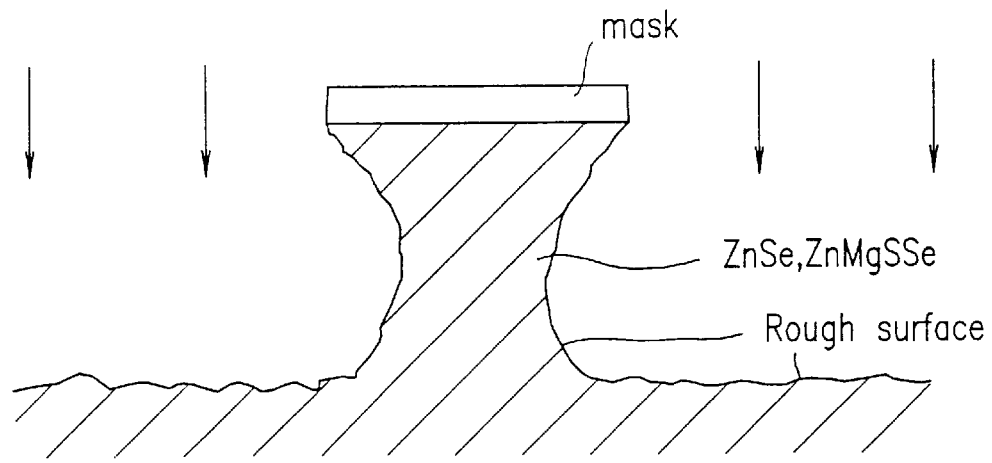

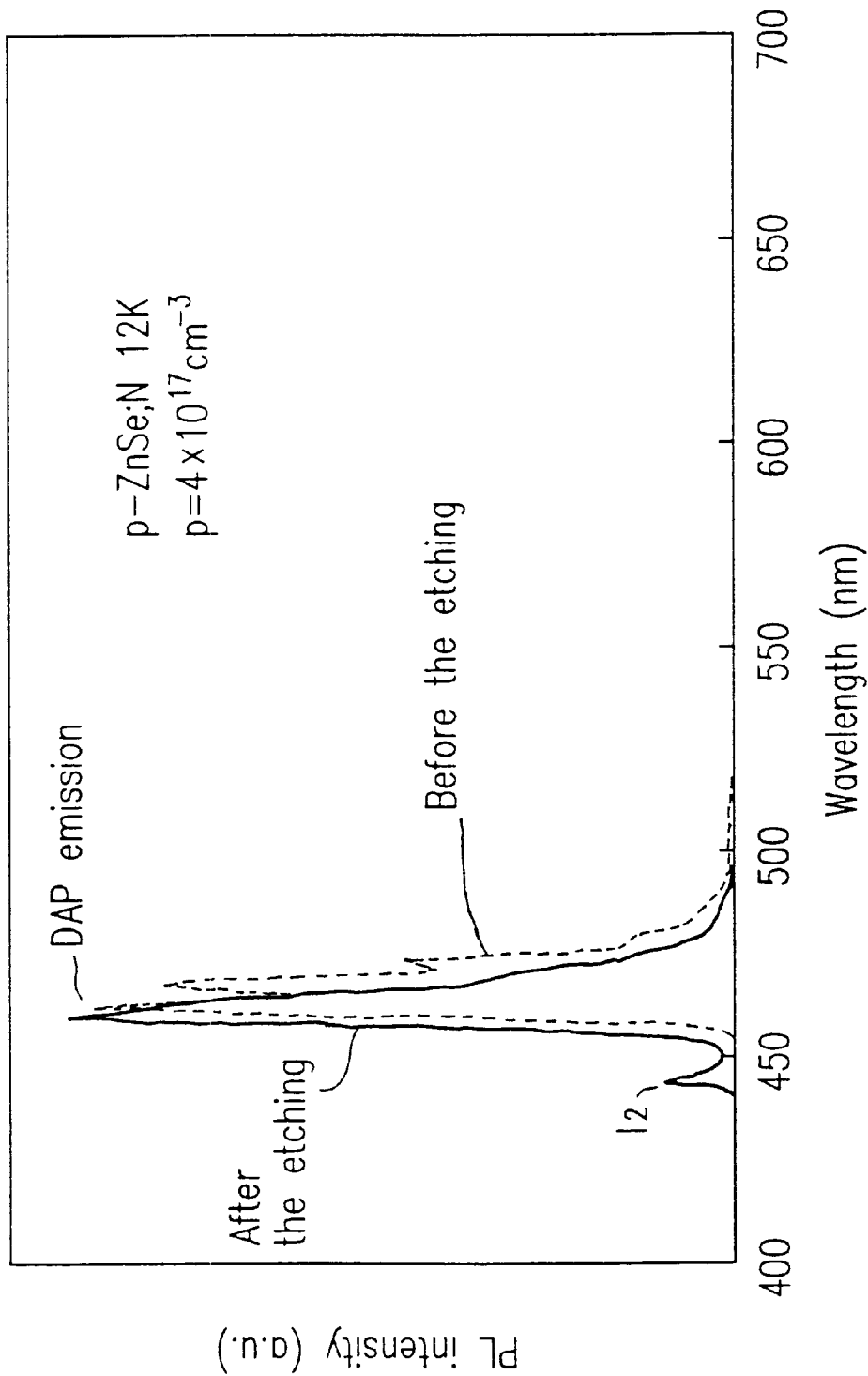

FIG.11
Returning laser light 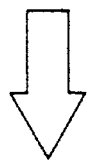 Emitted laser light 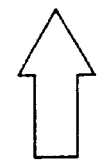
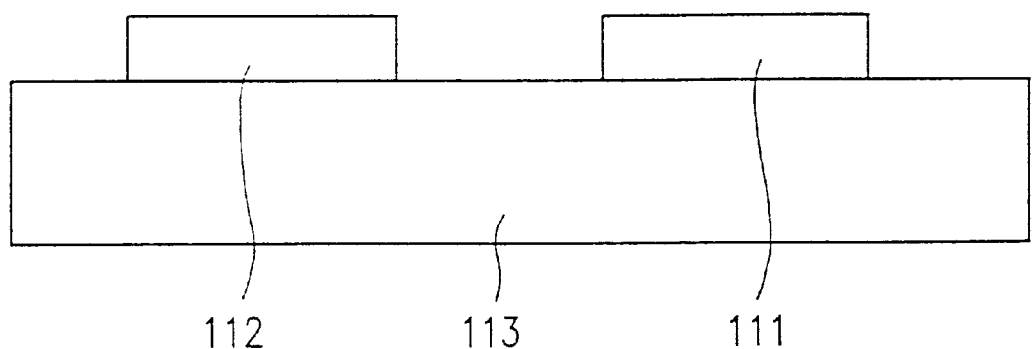
112   113   111

SEMICONDUCTOR LIGHT EMITTING DEVICE AND METHOD OF ETCHING

BACKGROUND OF THE INVENTION

1. Field of the Invention

The present invention relates to a vertical cavity type semiconductor light emitting device such as a surface emitting laser, and a light emitting apparatus, an optical disk apparatus and a recording apparatus utilizing the same. The present invention also relates to an etching method which can be used for fabricating the vertical cavity type semiconductor light emitting device.

2. Description of the Related Art

A ZnSe type II–VI group compound semiconductor material is a direct transition type semiconductor which has a substantially wide band gap. Thus, the material appears to be suitable for emitting blue laser light. Hence, the development of a semiconductor laser which emits blue laser light (hereinafter, simply referred to as a "blue semiconductor laser") employing the ZnSe type II–VI group compound semiconductor material is actively being performed.

The development of a vertical cavity type semiconductor laser is also conducted which employs a GaAs type III–V group compound semiconductor material. Furthermore, a vertical cavity type blue semiconductor laser is also reported which employs the ZnSe type II–VI group compound semiconductor material.

FIG. 13 is a structural cross-sectional view showing a conventional vertical cavity type surface emitting blue semiconductor laser employing a ZnSe type II–VI group compound semiconductor.

In the illustrated structure of the conventional vertical cavity type surface emitting blue semiconductor laser 1300 in FIG. 13, a Cl-doped n-type ZnSe epitaxial cladding layer 172, a multiple quantum well active layer 173 including ZnCdSe well layers and ZnSe barrier layers, and an N(nitrogen)-doped p-type ZnSe epitaxial cladding layer 174 are sequentially provided on an Si-doped n-type GaAs substrate 171. On the p-type cladding layer 174, a polycrystalline ZnO buried layer 1375 having an opening is provided and functions as a current constricting layer (a current blocking layer). A p-side mirror 177p including a multilayer structure of polycrystalline $SiO_2$ layers and polycrystalline $TiO_2$ layers is provided in the opening of the ZnO buried layer 1375. In a window 171a of a substrate 171 provided below the active layer 173, a n-side mirror 177n including a multilayer structure of polycrystalline $SiO_2$ layers and polycrystalline $TiO_2$ layers is provided. Furthermore, a p-type AuPd electrode 176 is provided so as to cover the p-side mirror 177p and the ZnO buried layer 1375. An n-type AuGe electrode 178 is provided on the bottom surface of the substrate 171 except for the window 171a.

In the surface emitting blue semiconductor laser 1300 as illustrated in FIG. 13, laser light emitted from the active layer 173 is amplified by using the p-side mirror 177p and the n-side mirror 177n and then is so emitted from the window 171a of the substrate 171 (in the downward direction in FIG. 13).

It is reported that the above-described structure affords a current injection type laser oscillation at a low temperature of 77K (see, for example, Applied Physics Letters, Vol. 66, No. 22, pp. 2929–2931, May 1995).

However, the conventional vertical cavity type blue surface emitting blue semiconductor laser shown in FIG. 13 allows a current to be injected from the p-type electrode 176 to the active layer 173 only through a narrow gap between the p-side mirror 177p and the current block layer 1375. Accordingly, electric resistance for the injected current increases. Moreover, the injected current flows in a spreading manner toward the n-type electrode 178 provided on the bottom surface of the substrate 171, as indicated by the arrows in FIG. 13.

Therefore, light is generated in the active layer 173 not only at a region thereof sandwiched by the p-side mirror 177p and the n-side mirror 177n but also in regions outside the sandwiched region. Thus, an outer portion of the generated light is not oscillated, resulting in no contribution to gain of the laser oscillation. Consequently, light emission efficiency decreases while threshold current density increases.

SUMMARY OF THE INVENTION

A vertical cavity type semiconductor light emitting device of the present invention includes: a light emitting layer made of a II–VI group compound semiconductor material; a first II–VI group compound semiconductor layer which has an opening at a position corresponding to the inside of the light emitting layer; and an upper mirror and a lower mirror which are provided so as to interpose the light emitting layer therebetween. A current is injected through the opening into the light emitting layer.

According to another aspect of the present invention, a vertical cavity type semiconductor light emitting device includes: a light emitting layer; and an upper mirror and a lower mirror which are provided so as to interpose the light emitting layer therebetween. Each of the upper mirror and the lower mirror is made of a II–VI group compound semiconductor material.

According to still another aspect of the present invention, a light emitting apparatus includes a vertical cavity type semiconductor light emitting device and an optical detector, both of which are provided on the same substrate, wherein the vertical cavity type semiconductor light emitting device has the structure as described above.

According to still another aspect of the present invention, a light emitting apparatus includes a plurality of vertical cavity type semiconductor light emitting devices which are integrally formed in an array within a single substrate, wherein each of the vertical cavity type semiconductor light emitting devices has the structure as described above.

According to still another aspect of the present invention, an optical desk apparatus includes: a vertical cavity type semiconductor light emitting device; light-collecting optics for collecting laser light emitted from the vertical cavity type semiconductor light emitting device onto a recording medium; and an optical detector which receives a reflected light from the optical disk, wherein the vertical cavity type semiconductor light emitting device has the structure as described above.

According to still another aspect of the present invention, a recording apparatus includes, as a light source, a vertical cavity type semiconductor light emitting device which has the structure as described above.

According to still another aspect of the present invention, an etching method includes the step of conducting dry etching of a II–VI group compound semiconductor layer using a predetermined mixed gas as an etchant. The mixed gas includes a first gas component and a second gas component. The first gas component is chlorine gas. The second gas component is a gas selected from the group consisting of hydrogen gas, nitrogen gas, and an inert gas.

According to still another aspect of the present invention, a method for etching a semiconductor multilayer structure, in which a II–VI group compound semiconductor layer is formed on a GaAs crystal, is provided. The method includes the step of conducting wet etching of the GaAs crystal using a mixed solution of $NH_4OH$, $H_2O_2$ and $H_2O$ as an etchant.

Thus, the invention described herein makes possible the advantage of (1) providing a vertical cavity type semiconductor light emitting device which realizes lasing oscillation at a sufficiently low threshold current density, (2) providing a light emitting apparatus, an optical disk apparatus and a recording apparatus utilizing the above-mentioned vertical cavity type semiconductor light emitting device, and (3) providing a etching method which can be used for fabricating the above-mentioned vertical cavity type semiconductor light emitting device.

These and other advantages of the present invention will become apparent to those skilled in the art upon reading and understanding the following detailed description with reference to the accompanying figures.

BRIEF DESCRIPTION OF THE DRAWINGS

FIG. 4A is a cross-sectional view schematically illustrating an etching profile obtainable by dry etching which uses a mixed gas of chlorine gas and hydrogen gas as an etchant.

FIG. 4B is a cross-sectional view schematically illustrating an etching profile obtainable by dry etching which uses chlorine gas as an etchant.

FIG. 5 is a graph illustrating changes in PL intensity spectrum before and after the etching;

FIG. 11 is a schematic view showing the exemplary configuration of a light emitting apparatus according to the present invention.

DESCRIPTION OF THE PREFERRED EMBODIMENTS

Hereinafter, the present invention will be described by way of illustrative examples with reference to the accompanying drawings.

Example 1

Figure 1A:
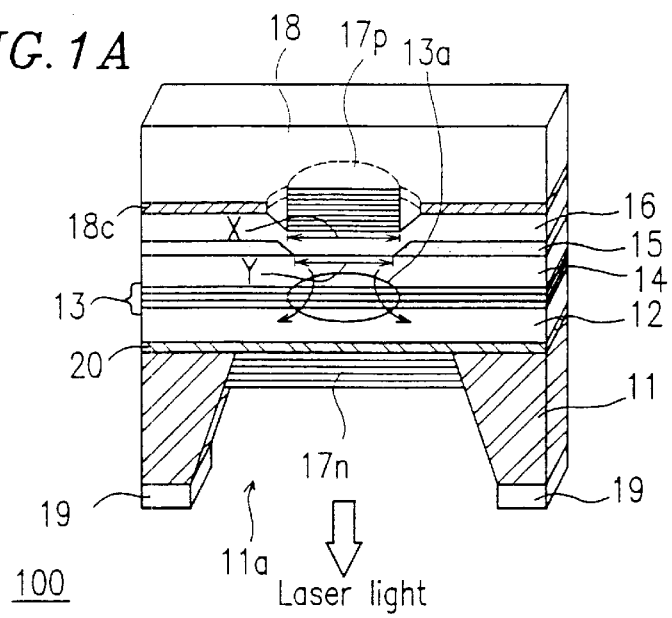
FIG. 1A is a structural cross-sectional view showing a first exemplary vertical cavity type surface emitting blue semiconductor laser using a ZnSe type II–VI group semiconductor material according to the present invention.
Figure 1B:
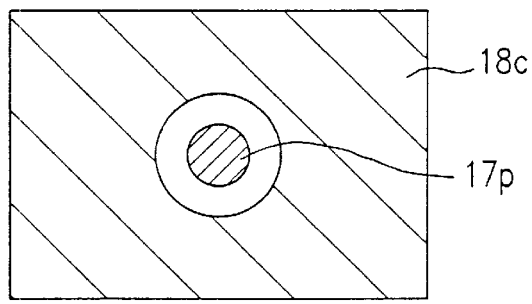
FIG. 1B is a plan view of the surface emitting blue semiconductor laser of FIG. 1A.
Figure 1C:
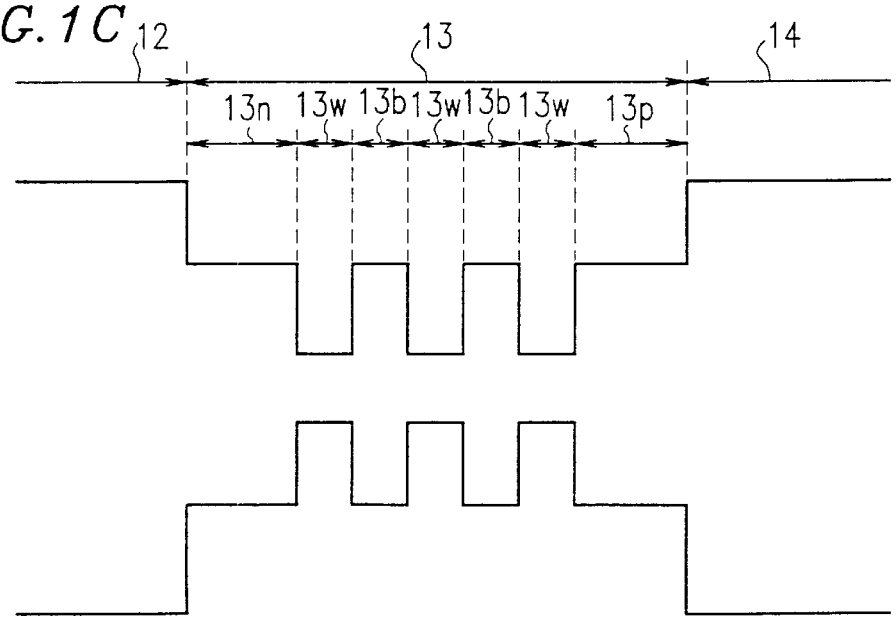
FIG. 1C is an energy band diagram of an active layer and in the vicinity thereof of the surface emitting blue semiconductor laser of FIG. 1A.

FIG. 1A is a structural cross-sectional view showing a first exemplary vertical cavity type surface emitting blue semiconductor laser 100 employing a ZnSe type II–VI group semiconductor material according to the present invention. FIG. 1B is a top plan view of the surface emitting blue semiconductor laser 100, although a p-type electrode is not illustrated therein. FIG. 1C is an energy band diagram of an active layer and in the vicinity thereof of the surface emitting blue semiconductor laser 100.

In the surface emitting blue semiconductor laser 100, a Cl-doped n-type ZnMgSSe epitaxial cladding layer 12, a multiple quantum well active layer (hereinafter, also referred to as a "light-emitting layer") 13, an N(nitrogen)-doped p-type ZnMgSSe epitaxial first cladding layer 14, a Cl-doped n-type ZnSSe epitaxial current blocking layer (i.e., a current constricting layer) 15, and an N(nitrogen)-doped p-type ZnSSe epitaxial second cladding layer 16 are sequentially provided on an Si-doped n-type GaAs substrate 11. An etching stopping layer (made of AlAs or AlGaAS) having a thickness of about 0.1 μm is provided between the GaAs substrate 11 and the above-mentioned layered structure. The current blocking layer 15 has an opening, and the second cladding layer 16 is formed on the current blocking layer 15 so as to cover the opening.

On the second cladding layer 16, a p-side mirror 17p including a multilayer structure of polycrystalline $SiO_2$ layers and polycrystalline $TiO_2$ layers is provided at a position corresponding to the opening of the current blocking layer 15. On the current blocking layer 15, a ZnTe contact layer 18c having an opening corresponding to the current blocking layer 15 is provided. A p-type AuPd electrode 18 is provided so as to cover the p-side mirror 17p and the contact layer 18c.

A window 11a is formed in the substrate 11 for obtaining laser light. An n-side mirror 17n having a multilayer structure of polycrystalline $SiO_2$ layers and polycrystalline $TiO_2$ layers is provided on the bottom surface of the window 11a. An n-type AuGeNiPd electrode 19 is provided on the bottom surface of the substrata 11 except for the window 11a.

According to the present example of the invention, as shown in the band diagram of FIG. 1C, the active layer 13 has a multiple quantum well structure including ZnCdSe well layers 13w (thickness: about 4 nm) and ZnSSe barrier layers 13b (thickness about 20 nm). Total of three ZnCdSe well layers 13w are provided. Furthermore, ZnSSe light confinement layers 13n and 13p (thickness: about 20 nm) are provided between the sidemost ZnCdSe well layers 13w and the cladding layers 12 and 14, respectively.

In the above-described structure of the surface emitting blue semiconductor laser 100, the p-type electrode 18 is formed on the entire upper surface of the n-type cladding layer 16 except a region provided with the p-side mirror 17p. Therefore, a large contact area is provided between the p-type electrode 18 and the p-type cladding layer 16, and thus, contact resistance therebetween can be reduced.

Furthermore, the ZnTe layer constituting the contact layer 18c is capable of being highly doped with p-type impurities as well as providing a band gap smaller than the band gap of the p-type cladding layer 16. Thus, use of the ZnTe layer as the contact layer is suitable for reducing contact resistance. It should be noted, however, the ZnTe contact layer 18c having a small band gap is provided only at regions surrounding the p-side mirror 17p, but is not provided directly below the p-side mirror 17p. This is because ZnTe absorbs emitted laser light.

Alternatively, instead of ZnTe which has a large lattice constant, a superlattice structure of ZnSe and ZnTe may be also used for constituting the contact layer 18c. In this case, the contact layer 18a includes ZnTe layers and ZnSe layers alternately deposited in such a manner as a ZnTe layer, a ZnSe layer, a ZnTe layer, . . . starting from the side of the ZnSSe cladding layer 16 to come to end with a ZnTe layer being in contact with the p-type electrode 18.

Alternatively, the contact layer 18c may be formed with an amorphous semiconductor layer such as Te.

When the contact layer 18c is formed as an epitaxial layer, for example, the contact layer 18c is a p-type ZnTe contact layer, ohmic contact is realized between the contact layer 18c and the p-type electrode 18 when the p-type electrode 18 is formed with Au. However, since the ZnTe contact layer 18c is an epitaxial layer, a misfit rate of lattice constants becomes large between the contact layer 18c and the underlying ZnSSe cladding layer 16. As a result, misfit dislocation is generated in the ZnTe contact layer 18c, resulting in deterioration of the lasing characteristics.

On the other hand, when the contact layer 18c is formed as an amorphous semiconductor layer such as Te deposited on the underlying epitaxial layer, there is no need to consider the disadvantages relating to the lattice mismatch in the contact layer 18c because the amorphous layer inherently has no periodical arrangement of atoms. Accordingly, dislocation relating to the lattice mismatch is not generated or propagated, resulting in an amorphous semiconductor contact layer of high quality. It is possible to obtain advantages of, for example, preventing voltage from increasing due to lattice defects in the contact layer and/or preventing current from being injected non-uniformly due to leakage along lattice defects in the contact layer. Thus, the lasing characteristics are prevented from deteriorating and the lifetime is prolonged.

A sufficient ohmic contact is also realized, when the contact layer 18c is formed as an amorphous semiconductor layer, by providing the p-type electrode 18 using Au.

A current injected from the p-type electrode 18 is concentrated at a center portion 13a of the active layer 13, located immediately below the p-side mirror 17p, due to the current blocking layer 15, whereby light is emitted at the center portion 13a of the active layer 13. In such a manner, a current can be effectively injected into the center portion 13a of the active layer 13 sandwiched by the p-side mirror 17p and the n-side mirror 17n. Thus, a sufficient gain required for laser oscillation in the region 13a sandwiched by the mirrors 17p and 17n can be obtained with a relatively low amount of current. Accordingly, a threshold current density required for laser oscillation can be also reduced.

It is preferable for the current blocking layer 15 to have tapered edges at the opening thereof since such a configuration allows the overlying p-type cladding layer 16 to be uniformly deposited without involving the undesirable formation of concave portions at the bottom thereof. It is preferable to set a width of the opening (represented as Y in FIG. 1A) at a value larger than a diameter of the p-side mirror 17p (represented as x in FIG. 1A). Such setting allows current to be more efficiently injected into the region 13a of the active layer 13 positioned immediately below the p-side mirror 17p.

Although an n-type ZnSSe epitaxial layer is used as the current blocking layer 15 in the above, a layer made of such a material as ZnSe, ZnS, ZnSSe, ZnSeTe, ZnSTe, ZnMgSSe or CdZnSSe can be used instead. Moreover, a superlattice structure of the above materials can be also used.

Furthermore, although an n-type conductive layer is employed as the current blocking layer 15 in the above, an undoped II–VI group compound semiconductor layer which is a highly resistive layer can be also used as the current blocking layer 15. Alternatively, a II–VI group compound semiconductor layer when added with oxygen impurities so as to be a highly resistive layer can be also used as the current blocking layer 15.

The current blocking layer 15 is formed so as to have a smaller refractive index as compared with the adjacent p-type ZnMgSSe cladding layer 14. For example, in the configuration of FIG. 1A, when the p-type ZnMgSSe cladding layer 14 has a composition of $Zn_{0.9}Mg_{0.1}S_{0.15}Se_{0.85}$ to have a refractive index of 2.64, the n-type ZnSSe current blocking layer is formed so as to have a composition of $ZnS_{0.06}Se_{0.94}$ to have a refractive index of 2.60. Alternatively, in order to form the current blocking layer 15 as a ZnMgSSe layer when the p-type MgSSe cladding layer 14 has the above composition, the current blocking layer 15 is formed as an undoped or n-type ZnMgSSe layer having a composition of $Zn_{0.8}Mg_{0.2}S_{0.35}Se_{0.65}$ to have a refractive index of 2.51.

In the case where a p-type ZnSSe epitaxial layer is used as the current blocking layer 15, the layer 15 needs to be provided in the n-side structure, i.e., below the active layer 13 (for example, in the n-type cladding layer 12). A method for obtaining such a structure will be as follows. An n-type ZnSSe buffer layer and then a p-type ZnSSe current blocking layer are grown on a GaAs substrate 11. Then, the p-type ZnSSe layer is etched to form an opening therein. Thereafter, a laser structure including an n-type ZnMgSSe cladding layer, a multiple quantum well active layer and a p-type ZnMgSSe cladding layer is grown on the obtained layers, whereby the similar current constricting structure is obtained.

Hereinafter, a method for producing the vertical cavity type surface emitting blue semiconductor laser 100 described above will be described with reference to FIGS. 2A through 2E.

In the present example, a Molecular Beam Epitaxy (MBE) method is employed for the growth of the ZnSe type II–VI group semiconductor material. Specifically, the AlAs or AlGaAs etching stopping layer 20 is first deposited on the Si-doped n-type GaAs substrate 11 by an MBE method. Thereafter, the Cl-doped n-type ZnMgSSe cladding layer 12, the multiple quantum well active layer (the light emitting layer) 13 (including the ZnCdSe well layers, the ZnSSe barrier layers and the optical guiding layers), the N(nitrogen)-doped p-type ZnMgSSe cladding layer 14, the Cl-doped n-type ZnSSe current blocking layer 15 are sequentially epitaxially grown on the GaAs substrate 11 (see FIG. 2A). It should be noted that in FIGS. 2A through 2E, for the purpose of simplification, the substrate 11 through the p-type cladding layer 14 are collectively illustrated as being one layer.

According to the above process, high-quality epitaxial layers are obtained since the layers to be grown with the MBE method on the GaAs substrate 11 via the etching stopping layer 20 are all made from the II–VI group compound semiconductor material which satisfies the lattice match condition with the GaAs substrate 11. In other words, each of the ZnMgSSe layers and the ZnSSe layers constituting the n-type cladding layer 12, the p-type cladding layer 14, the n-type current blocking layer 15 and the p-type second cladding layer 16 have compositions which satisfy the lattice match condition with the GaAs substrate 11. Therefore, high-quality epitaxial layers with minimum crystal defect can be obtained.

Prior to the growth of the II–VI compound semiconductor epitaxial layers on the Si-doped n-type GaAs substrate 11, it may be possible to first deposit a buffer layer, made of $ZnS_{0.06}Se_{0.94}$ or the like which satisfies the lattice match condition with GaAs, on the GaAs substrate 11, in order to enhance crystallinity or the like. The II–VI group compound semiconductor epitaxial layers may be grown after the deposition of the buffer layer.

Hereinafter, production steps after the crystal growth will be described.

Figure 2A:
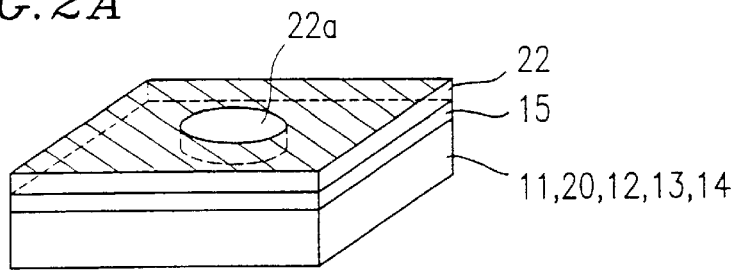
FIGS. 2A through 2E are perspective views showing production steps of the surface emitting blue semiconductor laser of FIG. 1A.
Figure 2B:
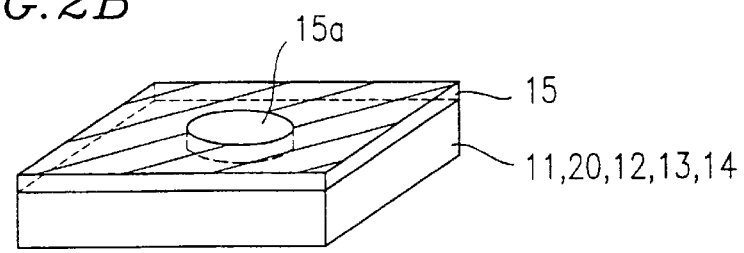

First, a resist pattern 22 having an opening 22a (diameter: about 16 μm) is formed on the Cl-doped, n-type ZnSSe current blocking layer 15 by a photolithography method, as shown in FIG. 2A. The current blocking layer 15 is then etched using the resist pattern 22 as a mask. By removing the resist pattern 22, an opening 15a is obtained in the current blocking layer 15, as shown in FIG. 2B.

Figure 2C:
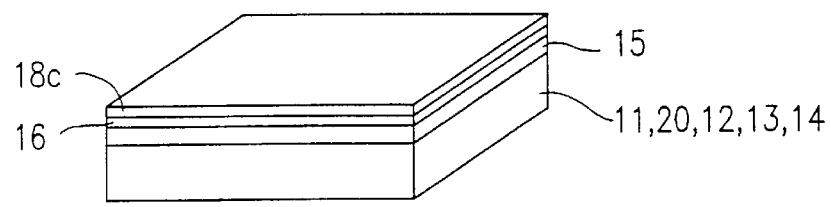

Then, a p-type ZnSSe second cladding layer 16 is epitaxially grown using an MBE method on the current blocking layer 15 including regions above the opening 15a thereof. The contact layer 18c is further deposited thereon. Consequently, the structure in which the n-type ZnSSe current blocking layer 15 is buried inside so as to exhibit the current constriction function is formed, as shown in FIG. 2C.

Figure 2D:
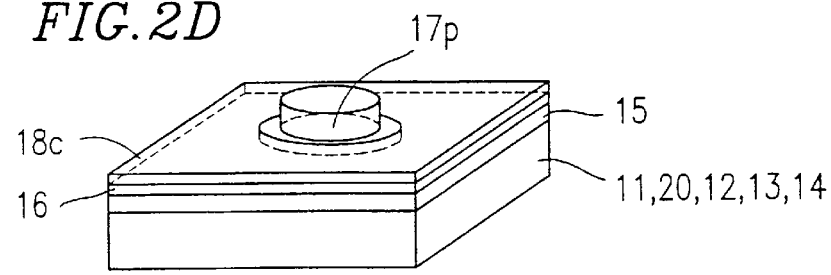
Figure 2E:
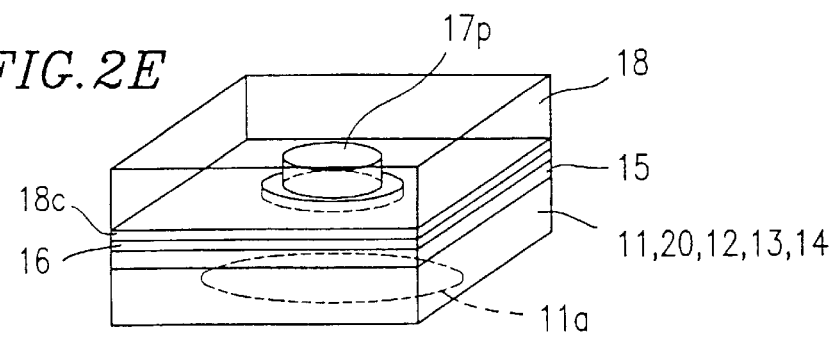

Then, a resist pattern (not shown) is formed to have a window (diameter: about 12 μm) to be used as a site for forming the p-side mirror 17p by a photolithography method. Polycrystalline $SiO_2$ layers and polycrystalline $TiO_2$ layers are deposited thereon by sputtering. Thereafter, the lift-off process is conducted so as to obtain the cylindrical-shaped, p-side mirror 17p (diameter: about 12 μm) as shown in FIG. 2D. The cylindrical-shaped, p-side mirror 17p may be formed using methods other than the lift-off process. For example, a multilayered structure to constitute the p-side mirror 17p may be formed first on the entire surface of the p-type second cladding layer 16. A mask may then be formed on the multilayered structure, which is then etched into a cylindrical-shape using the formed mask with an etching method such as dry etching using a $CF_4$ gas.

Thereafter, the p-type AuPd electrode 18 is formed on the N(nitrogen)-doped p-type ZnSSe second cladding layer 16 and the p-side mirror 17p as follows. A Pd layer is first deposited on the entire surface of the p-type second cladding layer 16 and the p-side mirror 17p to have a thickness of about 10 nm. Then, an Au layer is deposited on the Pd layer to have a thickness of about 200 nm. Consequently, the p-type AuPd electrode 18 is obtained which makes contact with the p-type ZnSSe second cladding layer 16 via the contact layer 18c.

Although the contact layer 1a may be omitted, it is preferable to provide the contact layer 18c made of a ZnTe layer or the like in order to reduce a driving voltage of the device by minimizing the contact resistance. In this case, however, in order to avoid an increase in internal loss caused by light absorption of the ZnTe contact layer 18c, an opening is preferably formed in the ZnTe contact layer 18c where the p-side mirror 17p will be formed. Specifically, in order to form the ZnTe contact layer 18c having the opening, a ZnTe layer is deposited on the entire surface of the p-type second cladding layer 16, and a resist mask having a predetermined pattern is then formed on the ZnTe layer. Then, the ZnTe layer is etched using the resist mask so that a ZnTe contact layer is formed on the p-type second cladding layer 16 except a region where the p-side mirror 17p will be formed.

Hereinafter, a production process with respect to the bottom surface side of the substrate 11 will be described.

First, in order to promote a photolithography method to be conducted as a later step, the bottom surface of the Si-doped n-type GaAs substrate 11 is etched away to a thickness of about 140 μm by using a mixed solution of $H_2SO_4:H_2O_2:H_2O$.

Then, in view of the fact that the GaAs substrate 11 is not transparent with respect to a blue-color wavelength band, the GaAs substrate 11 is further etched to form a window 11a (diameter: about 30 μm) so as to expose the n-type ZnMgSSe cladding layer 12 where the n-side mirror 17n will be formed. Specifically, an appropriate resist pattern is formed by a photolithography method and then the GaAs substrate 11 is wet-etched using a mixed solution of $NH_4OH:H_2O_2:H_2O$, thereby obtaining the window 11a.

Since the etching rate of the above-mentioned mixed solution (the etchant) for GaAs is 20 times faster than that of the same etchant for ZnMgSSe, the etching halts as soon as the GaAs substrate 11 is etched off to expose the underlying ZnMgSSe cladding layer 12, even without providing an appropriate etching stopping layer 20. Thus, an extremely flat ZnMgSSe surface can be exposed.

When the AlAs or AlGaAs etching stopping layer 20 is provided between the GaAs substrate and the ZnMgSSe layer, further large etching selectivity characteristics will be obtainable between AlAs or AlGaAs and ZnMgSSe, as compared with the case between GaAs and ZnMgSSe.

The mixed ratio of the above-described etchant can be as follows. Provided that $NH_4OH$ is in the range of 2 to 5, $H_2O_2$ is in the range of 30 to 70, and $H_2O$ is in the range of 10 to 40. For example, the mixed ration may be $NH_4OH:H_2O_2:H_2O$ is 5:35:36.

As previously described, in order to enhance crystallinity or the like, the II–VI group semiconductor epitaxial layers may be grown after a buffer layer made of ZnSe, ZnSSe or the like is grown on the GaAs substrate. In this case also, the above-described etchant for etching the GaAs substrate 11 can be used.

A multilayer structure of polycrystalline $SiO_2$ layers and polycrystalline $TiO_2$ layers is deposited by sputtering after providing the window 11a by etching in the GaAs substrate 11. Thereafter, the multilayer structure is subjected to the lift-off process so as to be processed into an n-side mirror 17n which is a laser light emitting window.

Thereafter, the n-side mirror 17n is coveted with a resist pattern by using the lithography method, and the n-type electrode 19 is formed on the bottom surface of the GaAs substrate 11 except the window 11a. Specifically, a Pd layer having a thickness of about 10 nm, an Ni layer having a thickness of about 10 nm, a Ge layer having a thickness of about 30 nm and an Au layer having a thickness of about 80 nm are sequentially deposited. The lift-off is then performed to obtain the n-type PdNiGeAu electrode 19. The heat treatment is performed at a temperature of about 200° C. for realizing an electrode with low electrical resistance.

Although a multilayered structure including a Pd layer, an Ni layer, a Ge layer and an Au layer is used in the above, a similar advantage can be obtained when an AuGe alloy layer is deposited on the Pd layer and the Ni layer. In this case, however, it is preferable that the Pd layer (the first layer) and the Ni layer (the second layer) have a thickness in the range of about 5 nm to about 20 nm, respectively.

The surface emitting blue semiconductor laser which has the above-described structure according to the present invention exhibits a laser oscillation at a room temperature with an extremely small threshold current of approximately 3 mA. The laser oscillation wavelength is about 510 nm and an obtained radiation angle is as narrow as approximately 7°. A current is constricted in a region sandwiched by the p-side and n-side mirrors 17p and 17n in the multi quantum well active layer 13 because of the epitaxial buried structure of n-type ZnSSe current blocking layer 15. Thus, a current injected from the AuPd electrode (the p-type electrode) 18 flown in cylindrical configuration into the center portion 13a of the multiple quantum well active layer 13. As a result, the laser beam becomes circular having a diameter of about 12 $\mu$m at the emitting facet which is relatively large. Thus, an extremely small radiation angle can be obtained.

In the case where the resist pattern 22 having an opening (diameter: about 16 $\mu$m) is used as a mask to etch the current blocking layer 15, wet etching is performed using a mixed solution of saturated bromine, phosphoric acid and water (e.g., mixed ratio of 1:2:3). However, wet etching is often associated with increased surface roughness of the etched surface, and it tends to be difficult to obtain a smoothly etched side wall by wet etching.

Recently, in connection with the above problem, a chlorine type dry etching is receiving much attention as a method for fine processing of compound semiconductors, and there have been several reports on a reactive ion etching on ZnSe using a hydrocarbon type gas. Even with these dry etching techniques, however, there are some problems such as slow etching rate (see Nikaido et al.; The Extended Abstracts of the Spring Convention of the Japanese Society of Applied Physics (1995), 30p-ZN-15, or in Ohtsuka et al.: J. Appl. Phys. 75 (1994) 8231). According to the present invention, a reactive ion beam etching (RIBE) is employed which uses a mixed gas of chlorine gas and hydrogen gas.

Figure 3:
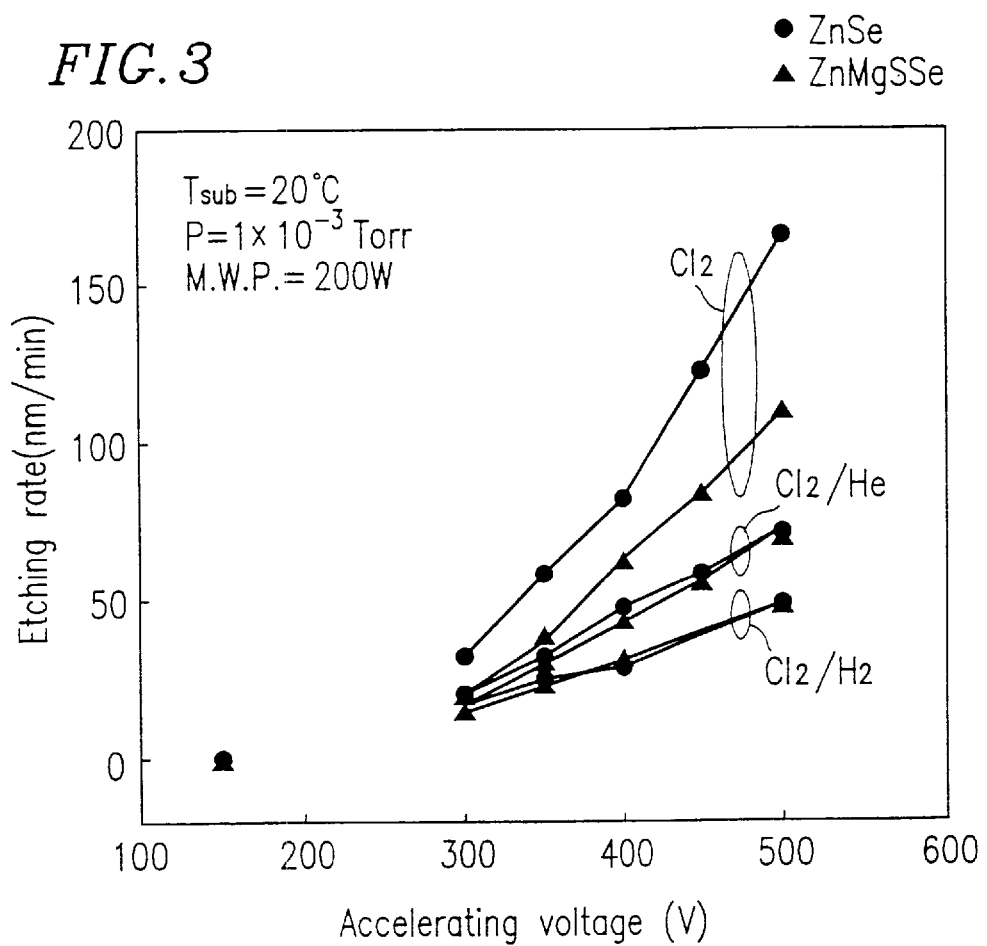
FIG. 3 is a graph illustrating an acceleration voltage dependency of an etching rate.

FIG. 3 is a graph illustrating an acceleration voltage dependency of an etching rate. The graph represents the data obtained in the cases of etching a ZnSe layer (black circle plots) and etching a ZnMgSSe layer (black triangular plots).

Specifically, data are measured at a substrate temperature $T_{sub}$=about 20° C., an etching pressure P=about 1×10$^{-3}$ Torr, and a microwave power M.W.P.=about 200 W using the test samples in which a ZnSe layer or a ZnMgSSe layer is grown on a GaAs substrate using an MBE technique. The etching is performed using three different etching gases: (1) chlorine gas (indicated as "Cl$_2$"); (2) a mixed gas of chlorine gas and hydrogen gas (indicated as "Cl$_2$/H$_2$"); and (3) a mixed gas of chlorine gas and helium gas (indicated as "Cl$_2$/He"). FIG. 3 indicates the average value with respect to both materials under the respective etching gas conditions.

Although there is no data for the etching of a ZnSSe layer which is employed for constituting the current blocking layer 15 in the present example, the results for the ZnSe layer is considered similar with the data for the ZnSSe layer as illustrated in FIG. 3.

As realized in FIG. 3, in both cases of ZnSe and ZnMgSSe, a rapid increase in the etching rate is observed in accordance with an increase in the acceleration voltage, and substantially high etching rates are obtainable for both ZnSe and ZnMgSSe with a large acceleration voltage. One feature to be noted here is that substantially equal etching rates of ZnSe and ZnMgSSe are obtained when the mixed gas of chlorine gas and hydrogen gas (Cl$_2$/H$_2$) and the mixed gas of chlorine gas and helium gas (Cl$_2$/He) is used. Thus, these mixed gases can be advantageously used for etching a heterojunction structure of ZnSe and ZnMgSSe included in a laser structure or the like so that both materials are etched at substantially the same etching rate with each other. Thus, in the case where the mixed gas is used as an etching gas (i.e., either the mixed gas of chlorine gas and hydrogen gas or the mixed gas of chlorine gas and helium gas), an extremely flat etched surface is obtainable as well as a smoothly etched side wall can be obtained with an etching angle of approximately 80° with respect to the substrate surface.

FIG. 4A is a cross-sectional view schematically showing a side wall of a ridge structure of ZnSe or ZnMgSSe obtainable from the RIBE dry etching which uses a mixed gas of chlorine gas and hydrogen gas according to the present invention. FIG. 4B is a cross-sectional view schematically showing a side wall of a ridge structure of ZnSe or ZnMgSSe obtainable from the RIBE dry etching which uses only chlorine gas according to the conventional technique.

As shown in FIG. 4A, the side wall etched by the mixed gas is smooth and has no roughness. No side etching is observed. On the other hand, as shown in FIG. 4B, in the case where only chlorine gas is used, side etching is observed and the etched surface is rough.

FIG. 5 is a graph illustrating changes in the PL intensity spectrum before and after the etching of N(nitrogen)-doped p-type ZnSe with using the mixed gas of chlorine gas and hydrogen gas as an etching gas. Upon the measurement of the date in FIG. 5, the PL intensity spectrum was measured at a temperature of about 12 K. The N(nitrogen)-doped p-type ZnSe layer to be etched had a p-type carrier concentration p of about 4×10$^{17}$ cm$^{-3}$.

As is shown in FIG. 5, any change is hardly seen in the PL intensity before and after the etching. This indicates that damage inflicted upon the surface by etching is extremely small.

Although the etching characteristics with respect to ZnSe and ZnMgSSe are described above, similar etching rates and similarly smooth etched surfaces can be obtained in the cases of ZnSSe and CdZnSe.

In the present example, the flow rate of gas is set to be about 5 sccm for both Cl$_2$ and H$_2$. Alternatively, when a ratio of the flow rate of H$_2$ to the flow rate of Cl$_2$ (H$_2$/Cl$_2$) satisfies the following relationship: 0.5<(H$_2$/Cl$_2$)<1.5), the etching characteristics such as the one described above can be obtained.

Although the mixed gas of hydrogen gas and chlorine gas is used in the above, similar advantages can be obtained for a mixed gas of nitrogen gas or an inactive gas (e.g., helium, neon or xenon) and chlorine gas.

In the first example of the present invention described above, the p-type AuGeNiPd electrode 18 is used. This is because since a ZnSe type II–VI group compound semiconductor material generally grows at a low temperature of 300° C. or lower, it is necessary to form an ohmic contact at a sinter temperature as low as possible so as not to cause adverse effects on the layered structure of the ZnSe type II–VI group compound semiconductor material already obtained.

Table 1 indicates the heat treatment temperature required for obtaining the p-type electrode 18 using various metals, and the resultant contact resistance values. In the case where an AuGeNiPd multilayered structure is used, a good ohmic contact with a low contact resistance of about $1.00 \times 10^{-4}$ $\Omega cm^2$ can be obtained by performing heat treatment at a temperature of about 200° C. for about 30 minutes.

TABLE 1

| Electrode material | InSn | AuSn | AuGeNiPd | AuGe |
|---|---|---|---|---|
| Heat treatment temperature (° C.) | 275 | 245 | 200 | 275 |
| Contact resistance ($\Omega cm^2$) | $1.84 \times 10^{-2}$ | $4.15 \times 10^{-2}$ | $100 \times 10^{-4}$ | $8.18 \times 10^{-3}$ |

Example 2

Figure 6A:
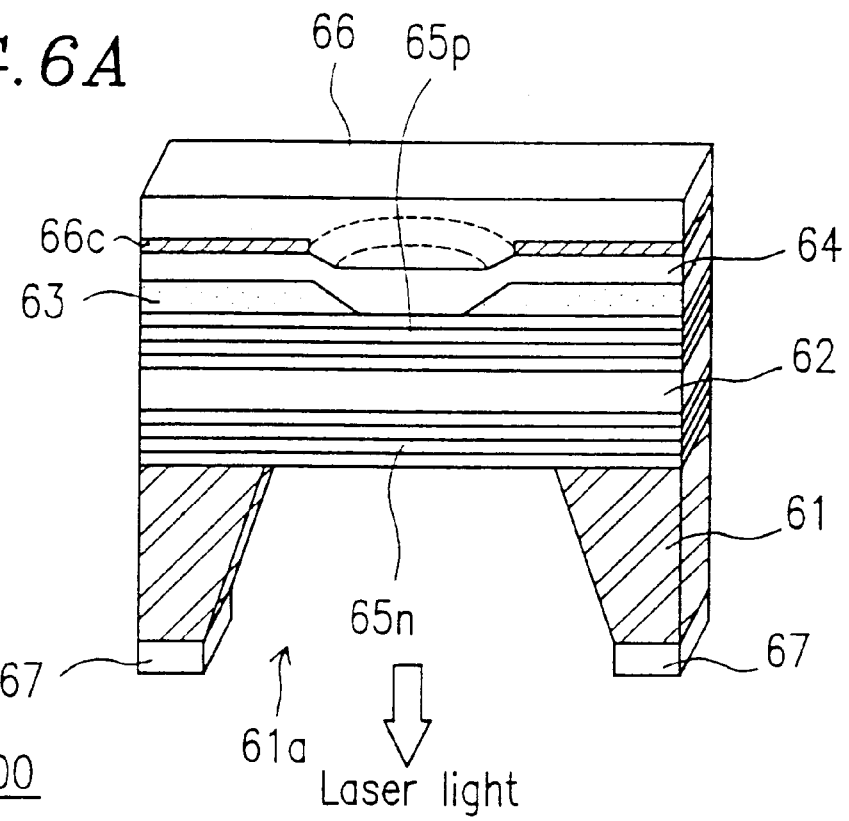
FIG. 6A is a structural cross-sectional view showing a second exemplary vertical cavity type surface emitting blue semiconductor laser using a ZnSe type II–VI group semiconductor material according to the present invention.
Figure 6B:
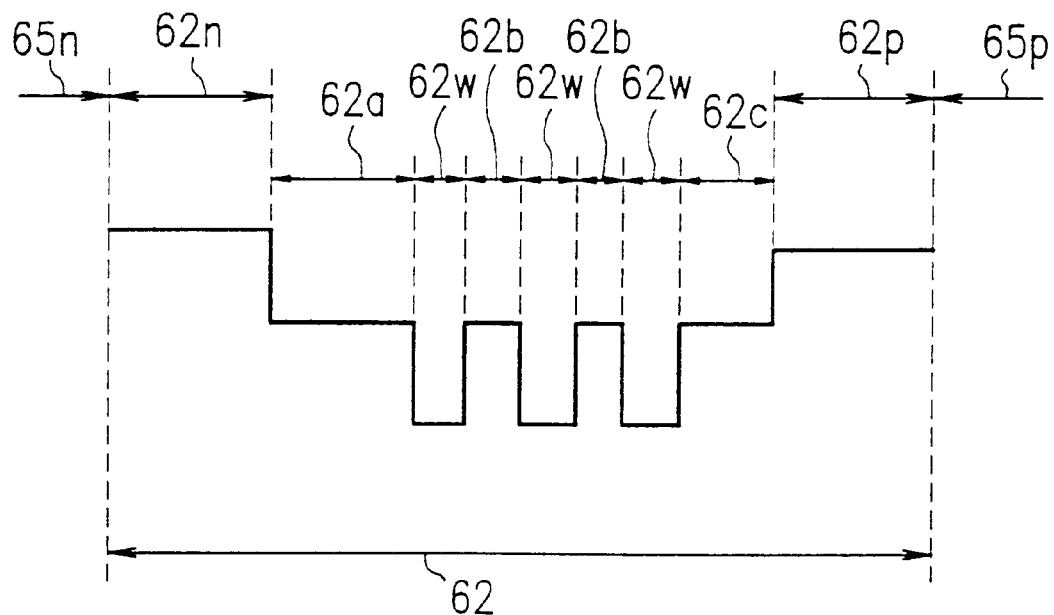
FIG. 6B is a energy band diagram of an active layer and in the vicinity thereof of the surface emitting blue semiconductor laser of FIG. 6A.

FIG. 6A is a structural cross-sectional view showing a second exemplary vertical cavity type surface emitting blue semiconductor laser 200 employing a ZnSe type II–VI group semiconductor material according to the present invention. FIG. 6B in an energy band diagram of an active layer and in the vicinity thereof of the surface emitting blue semiconductor laser 200.

The surface emitting blue semiconductor laser 200 is different from the previous laser 100 in that the p-side mirror and the n-side mirror are formed with a multilayered structure of the II–VI group compound semiconductor materials.

In the surface emitting blue semiconductor laser 200, an n-side mirror 65n, semiconductor active region 62 functioning as a light emitting layer, a p-side mirror 65p, a Cl-doped n-type ZnSSe current blocking layer 63 having a predetermined opening, and an N(nitrogen)-doped p-type ZnSSe cladding layer 64 are sequentially and epitaxially grown on an Si-doped n-type GeAs substrate 61.

In the present example, the n-side mirror 65n is formed from an n-type multilayered structure of Cl-doped ZnMgSSe epitaxial layers and Cl-doped ZnSSe epitaxial layers. On the other hand, a p-side mirror 65p is formed from a p-type multilayered structure of N(nitrogen)-doped ZnMgSSe epitaxial layers and N(nitrogen)-doped ZnSSe epitaxial layers.

As shown in FIG. 6B, the active region 62 includes an n-type ZnMgSSe cladding layer 62n, a ZnSSe light confinement layer 62a, ZnSSe well layers 62w (thickness: about 4 nm), ZnSSe barrier layers 62b (thickness: about 20 nm), a ZnSSe light confinement layer 62c, and a p-type ZnMgSSe cladding layer 62p. A total of three ZnCdSe wall layers 62w are provided. The ZnSSe light confinement layers 62a and 62c (thickness: about 20 nm) are provided between the sidemost ZnCdSe well layers 62w and the cladding layers 62n and 62p, respectively.

A p-type AuPd electrode 66 is formed on the p-type cladding layer 64 via a ZnTe contact layer 66c. The ZnTe contact layer 66c is employed to reduce contact resistance between the p-type electrode 66 and the p-type cladding layer 64, and is formed to surround the p-type mirror 65p with a predetermined opening pattern so as not to absorb laser light. An N-type AuGeNiPd electrode 67 is formed on the bottom surface of the GaAs substrate 61. A window 61a is formed in the GaAs substrate 61 through which the laser light is emitted.

An etching stopping layer may be provided between the GaAs substrate 61 and the semiconductor layered structure grown thereon, as in the first example.

Hereinafter, the p-side mirror 65p and the n-side mirror 65n of the present example, which are formed with the semiconductor multilayered structure, will be described.

Generally, semiconductors have extremely good thermal conductivity properties as compared with insulating materials. For example, a thermal conductivity of the II–VI group compound semiconductor is approximately 30 times as large as that of the $SiO_2$. Thus, in the case where the mirrors formed with a multilayered structure of ZnMgSSe epitaxial layers and ZnSSe epitaxial layers are used, heat generated in the active layer immediately beneath the mirrors can be dissipated without passing through an oxide thin film (an insulating thin film) such as an $SiO_2$ film or the like. Thus, a lasing operation at high temperature in realized.

Moreover, when the mirrors are formed with multilayered structure of an insulating material, a current cannot be injected therethrough. However, in the case of the mirrors formed with a multilayered structure of the II–VI group compound semiconductor materials such as the ZnMgSSe epitaxial layers and the ZnSSe epitaxial layers, impurities can be introduced to provide the mirrors with a certain conductivity. As a result, current injection through the mirrors becomes possible, resulting in an efficient current constriction and decreased threshold current density.

In the present example, each of the p-side mirror 65p and the n-side mirror 65n has a semiconductor multilayered structure of ZnMgSSe epitaxial layers and ZnSSe epitaxial layers doped with p-type or n-type impurities. Thus, current is efficiently constricted into a region of the light emitting layer immediately below the mirrors (i.e., a light emitting region interposed between the mirrors) so that high optical gain can be obtained in an optical cavity. As a result, good operational characteristics of the vertical cavity type semiconductor light emitting device (the surface emitting blue semiconductor laser) at a low threshold current density are obtained.

Example 3

Figure 7:
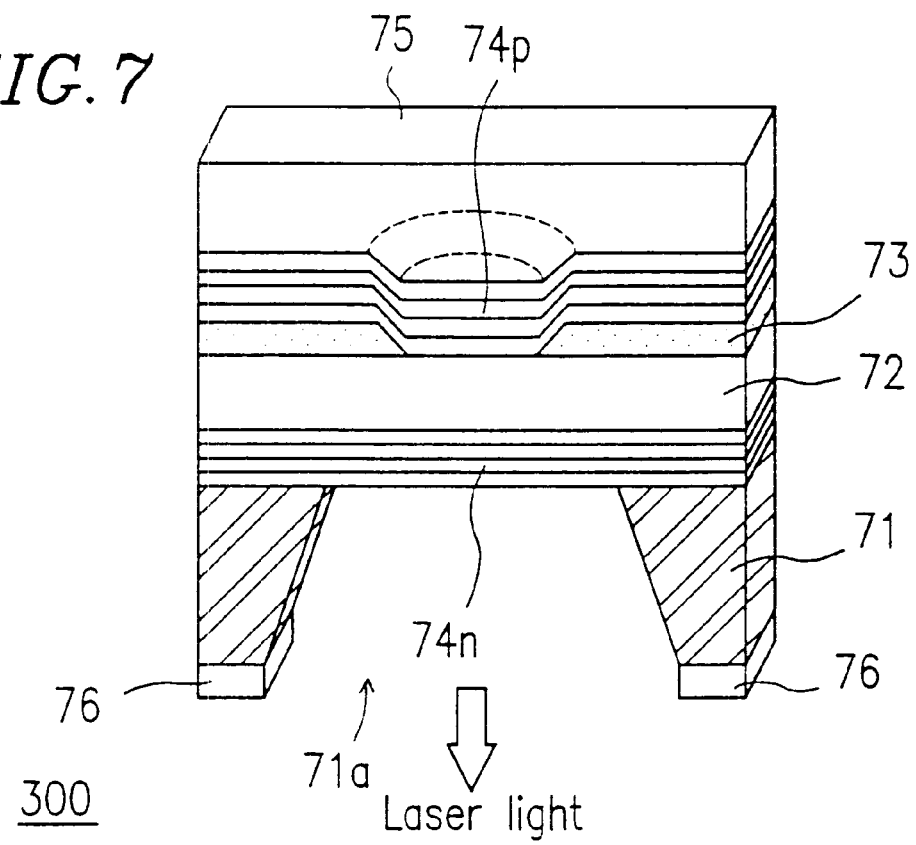
FIG. 7 is a structural cross-sectional view showing a third exemplary vertical cavity type surface emitting blue semiconductor laser using a ZnSe type II–VI group semiconductor material according to the present invention.

FIG. 7 is a structural cross-sectional view showing a third exemplary vertical cavity type surface emitting blue semiconductor laser 300 employing a ZnSe type II–VI group semiconductor material according to the present invention.

The surface emitting blue semiconductor laser 300 also employs the p-side mirror 74p and the n-side mirror 74n each having a multilayered structure of the ZnMgSSe epitaxial layers and the ZnSSe epitaxial-layers. Moreover, an MBE grown II–VI group compound semiconductor layer without being added with impurities, i.e., an undoped II–VI group compound semiconductor layer, becomes a high resistive layer. In the present example, such a high resistive layer is used as a current blocking layer. Thus, the current blocking layer can be provided immediately above an active layer to realize more effective current constriction.

FIG. 7 is a structural cross-sectional view showing the surface emitting blue semiconductor laser 300.

In the surface emitting blue semiconductor laser 300, an n-side mirror 74n having a semiconductor multilayered structure, a ZnSSe active layer 72, an undoped high resistive ZnSSe current blocking layer (the current constricting layer)

73, and a p-side mirror 74p having a semiconductor multi-layered structure are sequentially and epitaxially grown on an Si-doped, n-type GaAs substrate 71.

The current blocking layer 73 has an opening so that current injected from the p-type electrode 75 is allowed to be concentrated into the center region of the active region 72. The p-side mirror 74p is formed on the current blocking layer 73 so as to bury the opening.

In the present example, the n-side mirror 74n is formed from an n-type multilayered structure of Cl-doped ZnMgSSe epitaxial layers and Cl-doped ZnSSe epitaxial layers. On the other hand, a p-side mirror 74p is formed from a p-type multilayered structure of N(nitrogen)-doped ZnMgSSe epitaxial layers and N(nitrogen)-doped ZnSSe epitaxial layers. The p-type electrode 75 made of, for example, AuPd, is formed on the entire surface of the p-side mirror 74p. An n-type electrode 76 made of AuGeNiPd, for example, is formed on the bottom surface of the substrate 71.

Although not shown in the FIG. 7, a contact layer made of such a material as explained in the first example may be interposed between the p-aide mirror 74p and the p-type electrode 75 for reducing contact resistance therebetween. In addition, an etching stopping layer as described in the first example may be provided between the GaAs substrate 71 and the semiconductor multilayered structure formed thereon.

The active region 72 of the blue semiconductor laser 300 has a similar structure as the active region of the blue semiconductor laser 200. Specifically, the active region 72 includes, starting from the side closer to the n-side mirror 74n, an n-type ZnMgSSe cladding layer, a ZnSSe light confinement layer, an alternate structure (the quantum well structure) of well layers (thickness: about 4 nm) and barrier layers (thickness: about 20 nm), a ZnSSe light confinement layer and a p-type ZnMgSSe cladding layer₄ A total of three ZnCdSe well layers are provided. The ZnSSe light confinement layers (thickness: about 20 nm) are provided between the sidemost ZnCdSe well layers and the n-type/p-type ZnMgSSe cladding layers, respectively.

In the present example, the p-side mirror 74p and the n-side mirror 74n each have a semiconductor multi-layered structure doped with p-type or n-type impurities. Accordingly, current can be injected through the mirrors. Moreover, the injected current can be constricted so as to flow into a region of the active region 72 interposed between the p-side and n-side mirrors 74p and 74n. Thus, current is efficiently constricted into a light emitting region interposed between the mirrors so that a high optical gain can be obtained in an optical cavity, resulting in a low threshold current density. The laser light is emitted through the window 71a in the GaAs substrate 71 in the downward direction in FIG. 7.

Furthermore, since semiconductor materials have better thermal conductivity as compared with insulating materials, the semiconductor multilayered mirrors (of the ZnMgSSe epitaxial layers and the ZnSSe epitaxial layers) allow heat generated in the active layer immediately beneath or above the mirrors to be efficiently dissipated without passing through the oxide thin film (the insulating thin film) such as an SiO₂ film. Thus, a laser operation can be conducted at a high temperature.

Example 4

Figure 8:
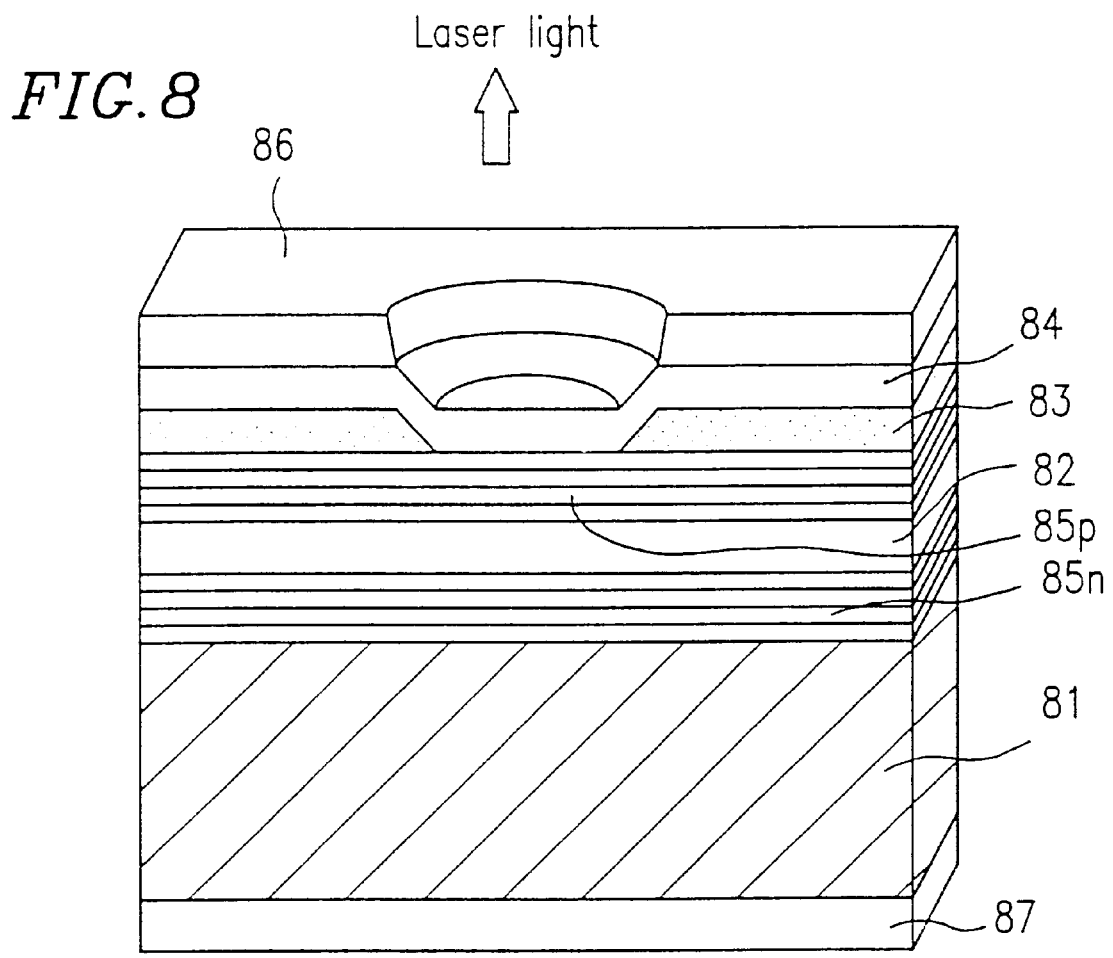
FIG. 8 is a structural cross-sectional view showing a fourth exemplary vertical cavity type surface emitting blue semiconductor laser using a ZnSe type II–VI group semiconductor material according to the present invention.

FIG. 8 is a structural cross-sectional view showing a fourth exemplary vertical cavity type surface emitting blue semiconductor laser 400 employing a ZnSe type II–VI group semiconductor material according to the present invention.

The surface emitting blue semiconductor laser 400 also employs the p-side mirror and the n-side mirror each having a multilayered structure of the ZnMgSSe epitaxial layers and the ZnSSe epitaxial layers. In the present example, however, laser light is obtained by forming an opening on the II–VI group compound semiconductor layers in the upward direction in the figure, instead of in the downward direction through the window in the substrate. Therefore, no etching of 1a GaAs substrate is required for forming a window for obtaining the laser light and thus the process can be simplified.

FIG. 8 is a structural cross-sectional view showing a vertical cavity type surface emitting blue semiconductor laser 400.

Specifically, an n-side mirror 85n having a semiconductor multilayered structure, a multiple quantum well active region 82 and a p-side mirror 85p having a semiconductor multilayered structure are provided on an Si-doped, n-type GaAs substrate 81. A Cl-doped, n-type ZnSSe current blocking layer (the current constricting layer) 83 to exhibit the current constricting function is provided on the p-side mirror 85p. The current blocking layer 83 has an opening for current to flow therethrough in a concentrated manner into the center region of the active region 83. An N(nitrogen)-doped, p-type ZnSSe cladding layer 84 is formed so as to cover the current blocking layer 83 to bury the opening.

The active region 82 has a similar structure as that within the surface omitting blue semiconductor lasers 200 and 300. Specifically, the active region 82 includes, starting from the side closer to the n-side mirror 85n, an n-type ZnMgSSe cladding layer, a ZnSSe light confinement layer, an alternate structure (a multiple quantum well structure) of well layers and barrier layers, a ZnSSe light confinement layer and a p-type ZnMgSSe cladding layer.

The n-side mirror 85n has an n-type multilayered structure of Cl-doped ZnMgSSe epitaxial layers and Cl-doped ZnSSe epitaxial layers. The p-side mirror 85p has a p-type multilayered structure of N(nitrogen)-doped ZnMgSSe epitaxial layers and N(nitrogen)-doped ZnSSe epitaxial layers. A p-type electrode 86 mods of, e.g., AuPd, is formed on the entire surface of the p-type cladding layer 84. An n-type electrode 87 made of, e.g., AuGeNiPd, is formed on the entire bottom surface of the substrate 81.

Although not shown in FIG. 8, a contact layer made of such a material as explained in the first example may be interposed between the p-side mirror 85p and the p-type electrode 86 for reducing contact resistance therebetween.

In the present example, the generated laser light is obtained through the II–V group compound semiconductor layers, instead of through the substrate 81. Thus, an opening is provided in the p-type electrode 86 so that the laser light is allowed to emit therethrough in an upward direction as shown in FIG. 8.

In the present example, the p-side mirror 85p and the n-side mirror 85n each has a semiconductor multilayered structure doped with p-type or n-type impurities. Accordingly, current can be injected through the mirrors. Moreover, the injected current can be constricted so as to flow into a region of the active region 82 interposed between the p-side and n-side mirrors 85p and 85n. Thus, current is efficiently constricted into a light emitting region interposed between the mirrors so that high optical gain can be obtained in an optical cavity, resulting in low threshold current density.

Since semiconductor materials have better thermal conductivity as compared with insulating materials, the semiconductor multilayered mirrors (of the ZnMgSSe epitaxial layers and the ZnSSe epitaxial layers) allow heat generated in the active layer immediately beneath or above the mirrors to be efficiently dissipated without passing through the oxide thin film (the insulating thin film) such as an $SiO_2$ film. Thus, a laser operation can be conducted at high temperature.

Example 5

Figure 9:
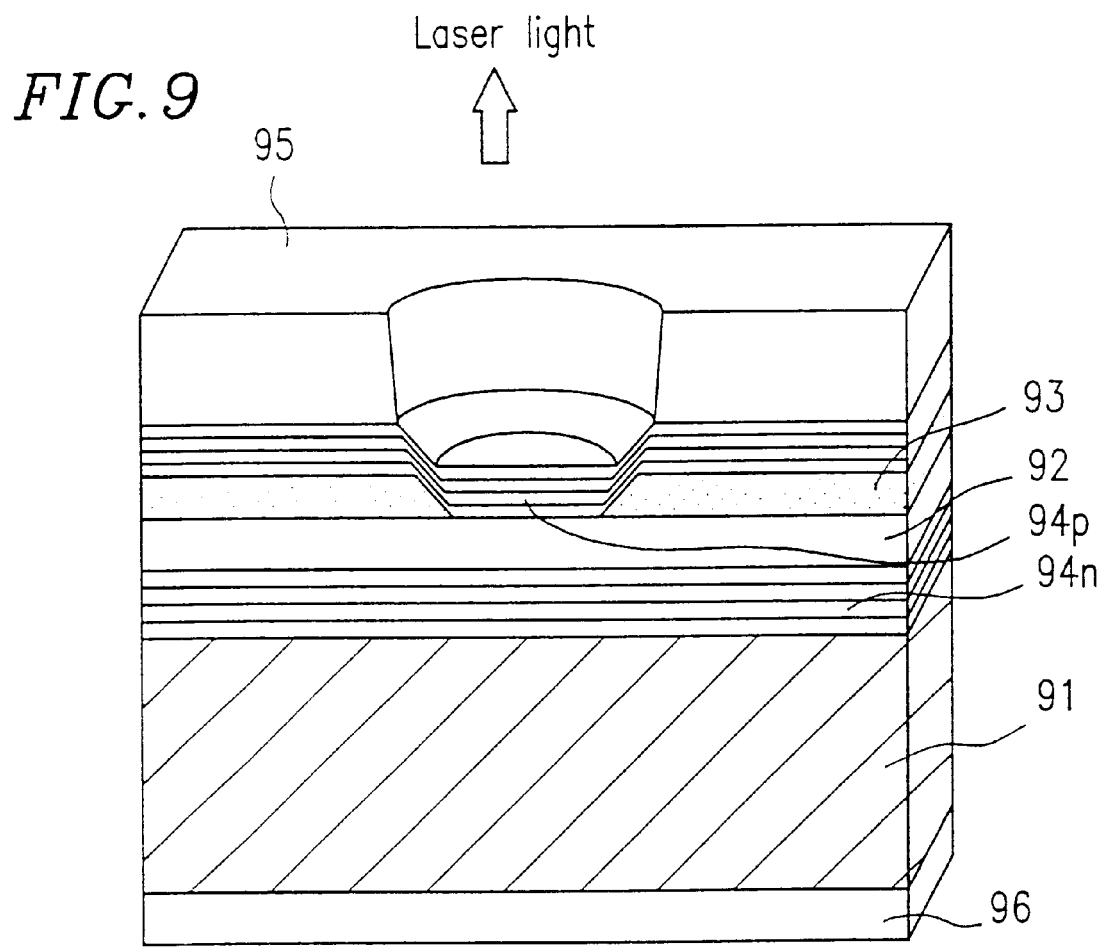
FIG. 9 is a structural cross-sectional view showing a fifth exemplary vertical cavity type surface emitting blue semiconductor laser using a ZnSe type II–VI group semiconductor material according to the present invention.

FIG. 9 is a structural cross-sectional view showing a fifth exemplary vertical cavity type surface emitting blue semiconductor laser 500 employing a ZnSe type II–VI group semiconductor material according to the present invention.

The surface emitting blue semiconductor laser 500 also employs the p-side mirror and the n-side mirror each having a multilayered structure of the ZnMgSSe epitaxial layers and the ZnSSe epitaxial layers, as in the surface emitting blue semiconductor lasers 200, 300, and 400. Moreover, an MBE grown II–VI group compound semiconductor layer without being doped with impurities, i.e., an undoped II–VI group compound semiconductor layer, becomes a high resistive layer. In the present example, such a high resistive layer is used as a current blocking layer. Thus, the current blocking layer can be provided immediately above an active layer to realize more effective current constriction.

In the present example, however, laser light is obtained by forming an opening on the II–VI group compound semiconductor layers in the upward direction in the figure, instead of in the downward direction through the window in the substrate. Therefore, no etching of a GaAs substrate is required for forming a window for obtaining the laser light and thus the process can be simplified.

FIG. 9 is a structural cross-sectional view showing the surface emitting blue semiconductor laser 500.

In the surface emitting blue semiconductor laser 500, an n-side mirror 94n having a semiconductor multilayered structure and an active region 92 are provided on an Si-doped n-type GaAs substrate 91. On the active region 92, an undoped high resistive ZnSSe current blocking layer (the current constricting layer) 93 to exhibit the current constricting function is provided. The current blocking layer 93 has an opening so that current injected from the p-type electrode 95 is allowed to be concentrated into the center region of the active region 92. The p-side mirror 94p having the semiconductor multilayered structure is formed on the current blocking layer 93 so as to bury the opening. A p-type electrode 95 made of, e.g., AuPd, is formed on the p-side mirror layer 94p. An opening corresponding to the opening in the current blocking layer 93 is formed in the p-type electrode 95. Laser light is emitted through the opening, i.e., in the upward direction in FIG. 9.

The active region 92 has a similar structure as that within the surface emitting blue semiconductor lasers 200, 300 and 400. Specifically, the active region 92 includes, starting from the side closer to the n-side mirror 94n, an n-type ZnMgSSe cladding layer, a ZnSSe light confinement layer, an alternate structure (a multiple quantum well structure) of well layers and barrier layers, a ZnSSe light confinement layer and a p-type ZnMgSSe cladding layer.

The n-side mirror 94n has an n-type multilayered structure of Cl-doped ZnMgSSe epitaxial layers and Cl-doped ZnSSe epitaxial layers. The p-side mirror 94p has a p-type multilayered structure of N(nitrogen)-doped ZnMgSSe epitaxial layers and N(nitrogen)-doped ZnSSe epitaxial layers. An n-type electrode 96 made of, e.g., AuGeNiPd, is formed on the entire bottom surface of the substrate 91.

Although not shown in FIG. 9, a contact layer made of such a material as described in the first example may be provided between the p-side mirror 94p and the p-type electrode 95 so as to reduce contact resistance therebetween.

In the present example, the generated laser light is obtained through the II–VI group compound semiconductor layers, instead of through the substrate 91. Thus, an opening is provided in the p-type electrode 96 so that the laser light is allowed to emit therethrough in the upward direction in the figure. Therefore, no etching of a GaAs substrate is required for forming a window for obtaining the laser light and thus the process can be simplified.

In the present example, the p-side mirror 94p and the n-side mirror 94n each has a semiconductor multilayered structure doped with p-type or n-type impurities. Accordingly, current can be injected through the mirrors. Moreover, the injected current can be constricted so as to flow into a region of the active region 92 interposed between the p-side and n-side mirrors 94p and 94n. Thus, current is efficiently constricted into a light emitting region interposed between the mirrors so that high optical gain can be obtained in an optical cavity, resulting in low threshold current density.

Since semiconductor materials have better thermal conductivity as compared with insulating materials, the semiconductor multilayered mirrors (of the ZnMgSSe epitaxial layers and the ZnSSe epitaxial layers) allow heat generated in the active layer immediately beneath or above the mirrors to be efficiently dissipated without passing through the oxide thin film (the insulating thin film) such as an $SiO_2$ film. Thus, a laser operation can be conducted at a high temperature.

As has been previously explained with reference to Table 1 in connection with the first example, the n-type AuGeNiPd electrode used as the n-type electrode 96 in the present example has relatively low contact resistance, although relatively high temperature is required for the heat treatment to form the electrode with a low resistance, as compared with other metal electrodes. Thus, AuGeNiPd is a suitable material as an electrode.

Example 6

Figure 10:
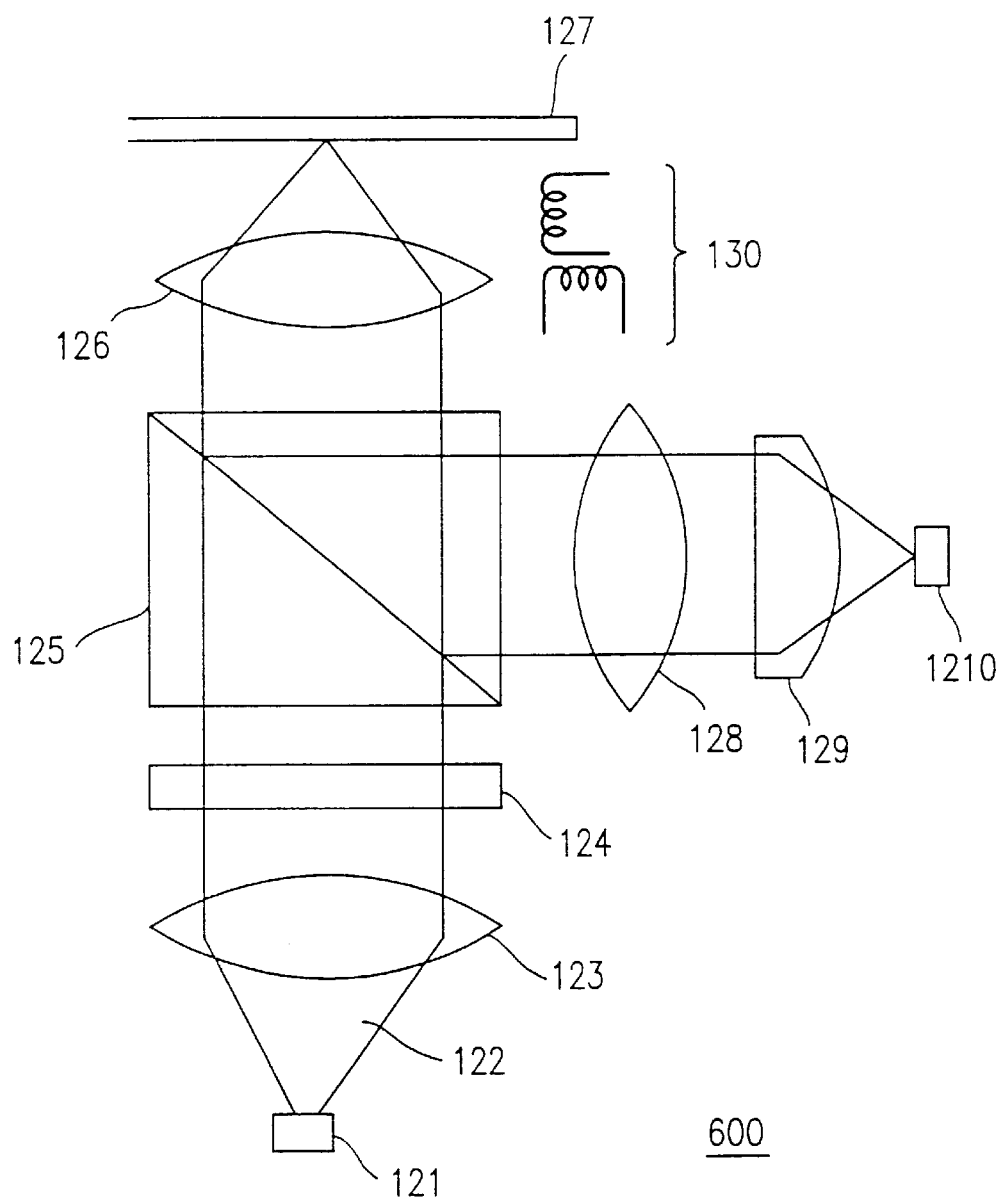
FIG. 10 is a schematic view showing the exemplary configuration of an optical disk apparatus according to the present invention.

Hereinafter, an optical disk apparatus 600 incorporating a vertical cavity type semiconductor light emitting device (specifically, a surface emitting semiconductor laser) according to the present invention will be described with reference to FIG. 10.

In the optical disk apparatus 600, the semiconductor laser 121 is of a can type in which a laser chip is contained in a can. Laser light 122 having a wavelength of about 480 nm is emitted from the can-type semiconductor laser 121 and collimated by a collimator lens 123. Thereafter, the collimated light is divided into three beams (although shown as one beam in the figure for the clarification) at a diffraction grating 124, passes through a half prism 125, and is collected by a collective lens 126 to make a spot having A diameter of about 1 μm on an optical disk 127.

Light which was reflected from the optical disk 127 once again passes through the collective lens 126, reflects off the half prism 125 and enters into an optical detector (a photodiode) 1210 through a light receiving lens 128 and a cylindrical lens 129 and a light interception lens 128. The photodiode 1210 converts the detected optical signal into an electric signal.

Upon the detection by the photodiode 1210, an offset of the light beam spot in the radial direction of the optical disk 127 (i.e., the tracking error) can be detected using the divided 3 beams. In addition, positional offset of a focusing point of the light beam spot in the direction perpendicular to the surface of the optical disk 127 (i.e., the focusing error) is detected by the cylindrical lens 129. The thus detected offsets (the tracking error and the focusing error) are compensated for by finely adjusting the position of the light beam spot on the optical disk 127 with a driving system 130. Specifically, the positional adjustment described above can be conducted by finely adjusting the position of the collecting lens 126 using the driving system 130.

Thus, the optical disk apparatus 600 includes a semiconductor laser 121, a light collection optics for guiding the laser light emitted from the semiconductor laser 121 onto the optical disk 127, and the optical detector 1210 which detects the reflected light from the optical disk 127. The optical disk apparatus performs a reading operation of the information signal recorded on the optical disk 127. Moreover, by increasing the optical output of the semiconductor laser 121, a writing operation onto the optical disk 127 can also be conducted. Thus, the optical disk apparatus 600 of simple configuration and exhibiting satisfactory characteristics is realized, which performs both the reading operation (the reproducing operation) and the writing operation (the recording operation) using the same semiconductor laser 121.

The semiconductor laser according to the present invention is a surface emitting type. When applied to the semiconductor laser 121 included in the optical disk apparatus 600, a laser beam which inherently has a circular shape can be utilized. Accordingly, the laser light beam 122 emitted from the semiconductor laser 121 can be incident on the optical disk 127 without being subjected to the beam shape modification. Thus, the light beam 122 emitted from the semiconductor laser 121 can be efficiently utilized, resulting in improved optical efficiency of the optical disk apparatus 600.

Moreover, the surface emitting semiconductor laser exhibits a small angle of the beam spreading (i.e., a small radiation angle). Thus, when the semiconductor laser of the present invention is applied to the configuration in FIG. 10, a satisfactory function thereof is obtainable even when the collimator lens 123 is omitted.

Example 7

FIG. 11 is a cross-sectional view schematically illustrating the configuration of the light emitting apparatus 700 in which the vertical cavity type semiconductor light emitting device (specifically, the surface emitting semiconductor laser) is employed.

In the apparatus 700, the vertical cavity type semiconductor light emitting device (for example, the surface emitting semiconductor laser) 111 according to the present invention and a light receiving device (an optical detector) 112 are formed side by side on the same GaAs substrate 113. By monolithicly forming the optical detector (the light-receiving device) 112 and the surface emitting laser 111 on the same substrate 113, optical axes thereof can be easily aligned with respect to each other. Thus, a monolithic device which can be produced at reduced cost can be obtained.

In addition, the semiconductor lasers according to the present invention are also applicable to a light source of a recording apparatus such as a printer.

Example 8

Figure 12A:
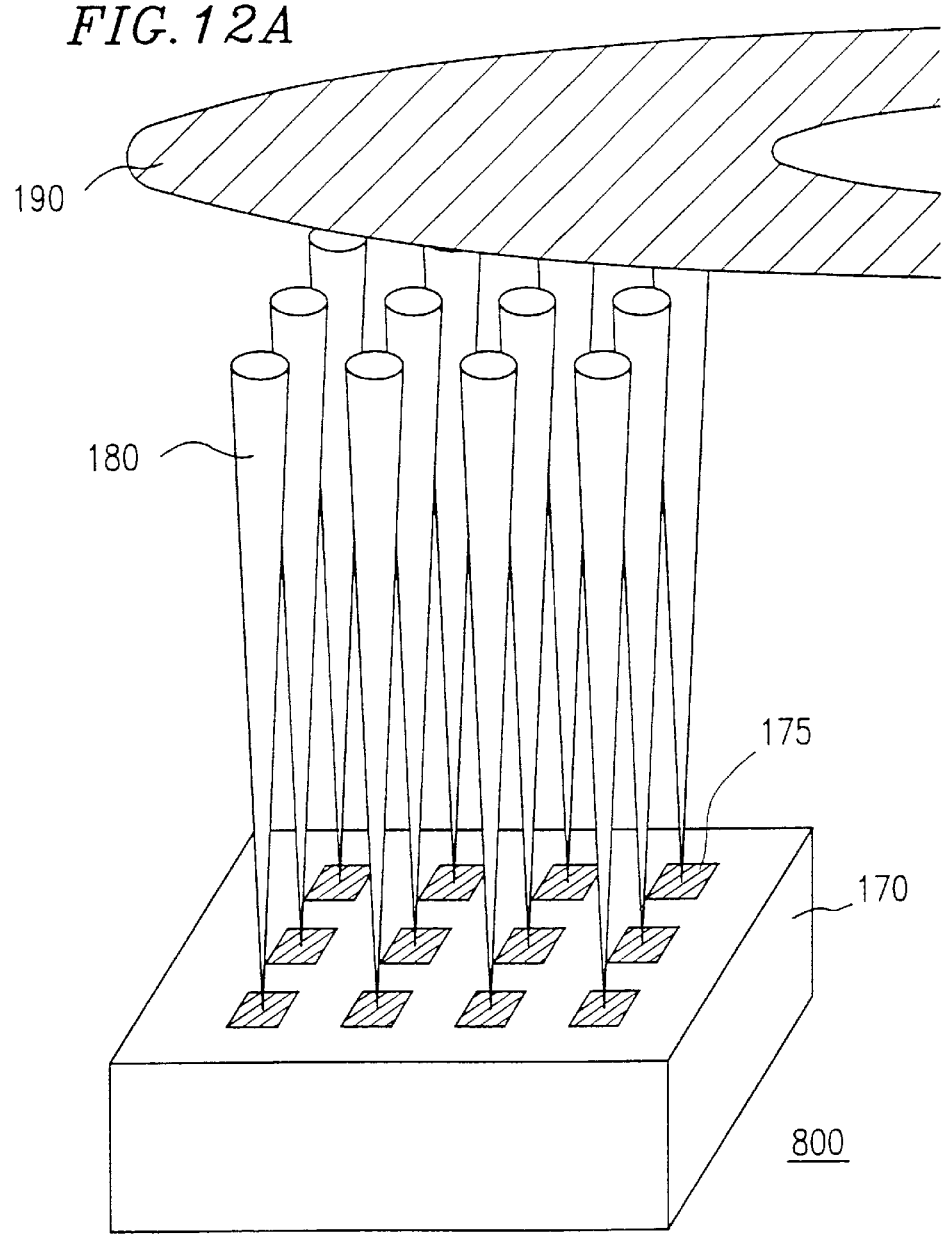
FIGS. 12A and 12B are a schematic perspective view and a cross-sectional view showing another exemplary configuration of a light emitting apparatus according to the present invention.

FIG. 12A is a perspective view schematically illustrating the configuration of the light omitting apparatus 800 in which the vertical cavity type semiconductor light emitting device (specifically, the surface omitting semiconductor laser) is employed.

Figure 12B:
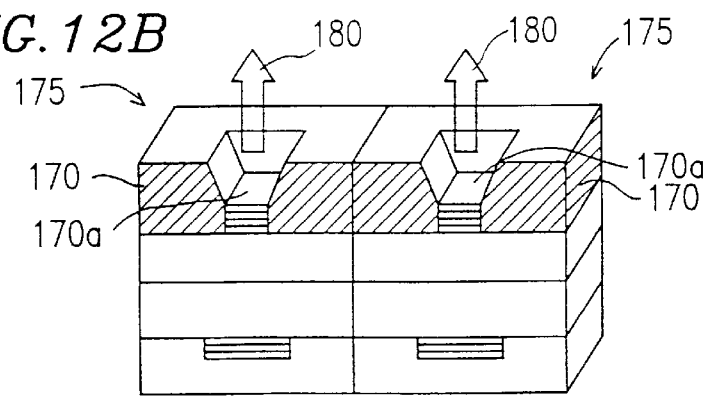
Figure 13:
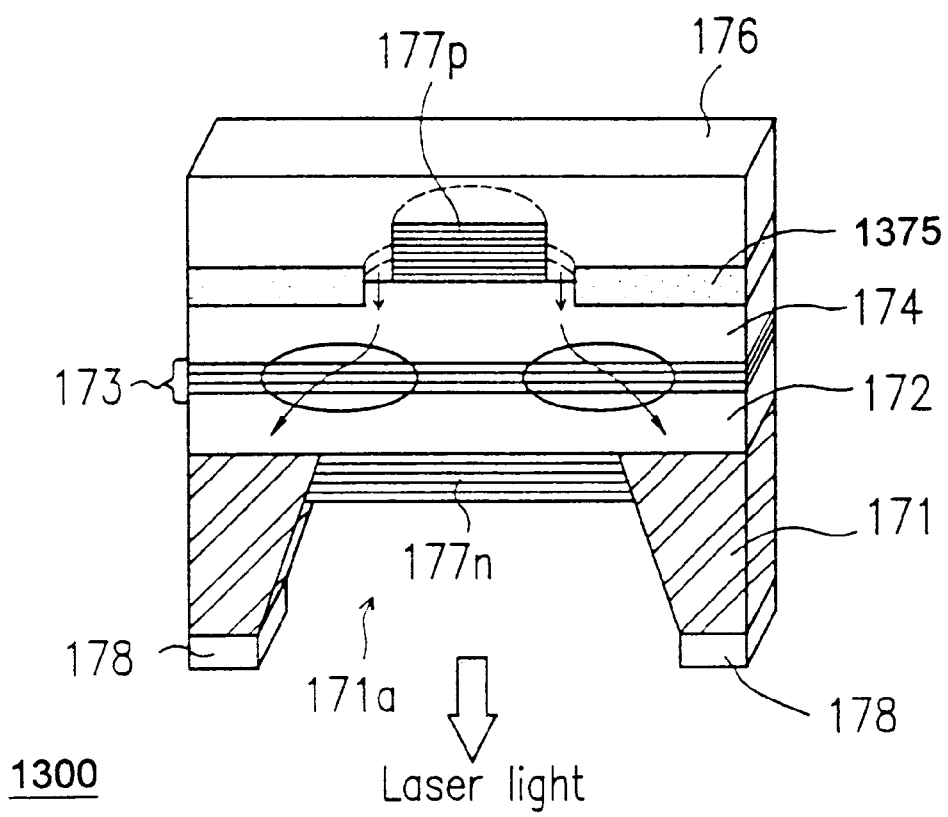
FIG. 13 is a structural cross-sectional view showing a conventional exemplary vertical cavity type surface emitting blue semiconductor laser.

Specifically, the light emitting apparatus 800 includes a plurality of the vertical cavity type semiconductor light emitting devices (specifically, the surface emitting semiconductor lasers) 175 arranged in an array on the same GaAs substrate 170. Each of the surface emitting semiconductor laser 175 may have the configuration as explained previously in either of the examples. For example, as schematically illustrated in a cross-sectional view of FIG. 12B, a laser light 180 is emitted from each of the surface emitting semiconductor laser 175 through a window 170a formed in a substrate 170. Alternatively, a laser light may be emitted through a window formed in a semiconductor multilayered structure formed on the substrate.

The light emitting apparatus 800 including an integrated array of the surface emitting semiconductor lasers 175 can be used as a light source in the optical disk apparatus. A plurality of laser beams respectively emitted from the surface emitting semiconductor lasers 175 in the array can be simultaneously incident on the optical disk 190 in parallel. Thus, reading out and/or writing of a plurality of information signals can be performed simultaneously in parallel, resulting in recording and reproducing of information signals at high speed and with high density.

As described above, in the vertical cavity type semiconductor light emitting device according to the present invention, the light emitting region including the active layer is formed with II–VI group compound semiconductor materials. A II–VI semiconductor layer with an opening is buried above the active layer so as to function as a current blocking layer (a current constricting layer). Accordingly, current is constricted so as to be efficiently injected only into a region of the active layer (the light emitting region) interposed between a pair of mirrors. As a result, the current-driven vertical cavity type semiconductor light emitting device (e.g., a surface emitting blue semiconductor laser) having a low threshold current density and exhibiting satisfactory operational characteristics is realized.

By providing a contact layer having an opening above the active layer (e.g., an ZnTe contact layer), contact resistance is reduced while keeping optical loss (resulting from absorption of the generated light by the contact layer) at a low level.

Mirrors provided so as to interpose the active layer (the light emitting region) therebetween are conventionally have a multilayer structure of insulating materials (oxides) such as $SiO_2$. Heat generated in the active layer immediately below the mirrors has to be dissipated through the mirrors. However, the insulating materials tend to have a relatively small value of thermal conductivity, resulting in insufficient heat dissipation. On the other hand, by constituting the mirrors with a multilayered structure of II–VI group compound semiconductor materials as in the present invention, heat generated in the active layer immediately below the mirrors can be efficiently dissipated through the mirrors. As a result, a lasing operation of the device can be realized at a higher temperature.

When the mirrors have a multilayered structure of the insulating materials, current can not be injected therethrough. On the other hand, by constituting the mirrors with a multilayered structure of II–VI group compound semiconductor materials as in the present invention, such as of ZnMgSSe epitaxial layers and ZnSSe epitaxial layers, a certain conductivity can be provided to the mirrors through introduction of impurities. Accordingly, current injection through the mirrors is realized, resulting in efficient current constriction and reduced threshold current density.

For etching the II–VI group compound semiconductor epitaxial layer, dry etching can be performed with a mixed gas as an etchant which includes, as a first gas component, chlorine gas, and as a second gas component, either of hydrogen gas, nitrogen gas or an inert gas. In such an etching, less damage is introduced to the etched surface, a high etching rate can be obtained, and a satisfactory vertical wall can be formed. Thus, a structure which allows current to efficiently constrict can be formed.

When the GaAs substrate for the vertical cavity type semiconductor light emitting device is etched so as to form a window therein through which the generated laser light is to emit, wet etching may be performed using a mixed solution of $NH_4OH$, $H_2O_2$ and $H_2O$ as an etchant. In such wet etching, a window can be easily formed in the substrate. In addition, after the fabrication of the window, an electrode made of such a material as PdNiGeAu can be formed on the substrate, e.g., the n-type GaAS substrate, at a low temperature.

The light emitting apparatus as described above can be easily connected (i.e., optically coupled) with a plurality of plastic fibers by inserting the fibers into the windows for emitting the light. Parallel optical data transmission can thus be easily realized. Specifically, the surface emitting semiconductor laser according to the present invention provides a blue laser light with a wavelength of about 480 nm while plastic optical fibers tend to exhibit a small propagation loss with respect to the light with the about 480 nm wavelength. Accordingly, a light source with low loss can be realized.

A vertical cavity type semiconductor light emitting device (e.g., a surface emitting semiconductor laser) according to the present invention is provided with a current blocking layer, for effectively injecting current in a region of a light-emitting layer interposed between the mirrors having a multilayered structure. Accordingly, a lasing operation can be performed with low threshold current.

Moreover, by constituting the p-side mirror and the n-side mirrors with a semiconductor multilayered structure which has a good thermal conductivity, heat generated in an active layer immediately beneath or above the multilayered mirrors can be effectively dissipated through the mirrors. Thus, a lasing operation can be conducted at high temperature.

Moreover, laser light can be emitted on the multilayered structure of II–VI semiconductor materials. In that case, no window is required to be formed in a substrate, thereby simplifying the production process and thus enhancing the production yield.

The active layer can be made to have an alternate structure (the multiple quantum wall structure) of well layers and barrier layers. Light confinement layers having a band gap lower than that of the cladding layers and equal to or more than that of the barrier layers can be interposed between the alternate structure and the cladding layers. Thus, an overflow of carriers can be prevented, thereby reducing threshold current density.

Moreover, except for the well layers in the quantum well structure (i.e., the active layer and the active region), the ZnMgSSe cladding layers, the ZnSSe current blocking layer and the mirrors having a semiconductor multilayered structure of ZnMgSSe and ZnSSe can satisfy a lattice match with the GaAs substrate. Therefore, defect density in crystals constituting the respective layers included in the multilayered structure to be formed on the GaAs substrate can be reduced. This results in the prolonged lifetime of the device. In particular, the composition that provides the lattice match with the GaAs substrate are $Zn_{0.9}Mg_{0.1}S_{0.15}Se_{0.85}$ and $ZnS_{0.06}Se_{0.94}$.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A vertical cavity type semiconductor light emitting device, comprising:

a light emitting layer made of a II–VI group compound semiconductor material;

a first II–VI group compound semiconductor layer which has an opening at a position corresponding to the inside of the light emitting layer; and upper and lower second II–VI group compound semiconductor layers which are provided so as to interpose the first II–VI group compound semiconductor layer therebetween, an upper mirror and a lower mirror which are provided so as to interpose the light emitting layer therebetween, wherein a current is injected through the opening into the light emitting layer; and wherein the first II–VI group compound semiconductor layer has a refractive index smaller than a refractive index of each of the upper and lower second II–VI group compound semiconductor layers.

2. A vertical cavity type semiconductor light emitting device according to claim 1, wherein the first II–VI group compound semiconductor layer has a first conductivity type, and each of the upper and lower second II–VI group compound semiconductor layers has a second conductivity type, the current being constricted by the first II–VI group compound semiconductor layer so as to be injected into the light emitting layer.

3. A vertical cavity type semiconductor light emitting device according to claim 2, wherein the light emitting layer is a multiple quantum well layer constituted with a ZnSSe barrier layer and a plurality of ZnCdSe well layers.

4. A vertical cavity type semiconductor light emitting device according to claim 3, further comprising a II–VI group compound semiconductor light confinement layer provided between the light emitting layer and the lower second II–VI group compound semiconductor layer, the light confinement layer having a band gap which is equal to or larger than a band gap of the barrier layer of the light emitting layer and smaller than a band gap of the lower second II–VI group compound semiconductor layer.

5. A vertical cavity type semiconductor light emitting device according to claim 1, wherein a width of the opening of the first II–VI group compound semiconductor layer is smaller than a diameter of the upper mirror.

6. A vertical cavity type semiconductor light emitting device according to claim 1, wherein the first II–VI group compound semiconductor layer has a tapered edge at the opening.

7. A vertical cavity type semiconductor light emitting device according to claim 1, wherein the first II–VI group compound semiconductor layer is a layer of a high electrical resistance.

8. A vertical cavity type semiconductor light emitting device according to claim 1, wherein the first II–VI group compound semiconductor layer is a layer selected from the group consisting of a ZnSe layer, a ZnS layer, a ZnSSe layer, a ZnSeTe layer, a ZnSTe layer, a ZnMgSSe layer and a CdZnSSe layer.

9. A vertical cavity type semiconductor light emitting device according to claim 8, wherein the first II–VI group compound semiconductor layer is a ZnSSe layer or a ZnMgSSe layer.

10. A vertical cavity type semiconductor light emitting device according to claim 1, further comprising a contact layer having an opening at a position above the light emitting layer.

11. A vertical cavity type semiconductor light emitting device according to claim 10, wherein the contact layer is constituted as 1a ZnTe layer, d superlattice layer including a ZnTe layer, or an amorphous semiconductor layer.

12. A vertical cavity type semiconductor light emitting device according to claim 1, wherein the first II–VI group compound semiconductor layer is positioned immediately above or immediately below the upper mirror.

13. A vertical cavity type semiconductor light emitting device according to claim 1, wherein each of the upper mirror and the lower mirror is constituted with a II–VI group compound semiconductor material.

14. A vertical cavity type semiconductor light emitting device according to claim 1, further comprising an electrode metal layer having an opening at a position above the light emitting layer.

15. A vertical cavity type semiconductor light emitting device according to claim 1, wherein the lower second II–VI group compound semiconductor layer is a ZnMgSSe layer.

16. A vertical cavity type semiconductor light emitting device according to claim 1, wherein the light emitting layer is a multiple quantum well layer constituted with a ZnSSe barrier layer and a plurality of ZnCdSe well layers.

17. A vertical cavity type semiconductor light emitting device according to claim 1, provided on a GaAs substrate via a buffer layer, wherein the buffer layer is a ZnSe layer or a ZnSSe layer.

18. A vertical cavity type semiconductor light emitting device according to claim 1, further comprising an electrode provided on a GaAs substrate, wherein the electrode is formed with a material including Au, Ge, Ni and Pd.

19. A light emitting apparatus, comprising the vertical cavity type semiconductor light emitting device of claim 1 and an optical detector, both of which are provided on the same substrate.

20. A light emitting apparatus comprising a plurality of the vertical cavity type semiconductor light emitting device of claim 1 which are integrally formed in an array within a single substrate.

21. An optical disk apparatus, comprising:
the vertical cavity type semiconductor light emitting device of claim 1;
light-collecting optics for collecting laser light emitted from the vertical cavity type semiconductor light emitting device onto a recording medium; and
an optical detector which receives a reflected light from the optical disk.

22. An optical disk apparatus according to claim 21, wherein an information recorded on the recording medium is read out using the laser light emitted from the vertical cavity type semiconductor light emitting device.

23. A recording apparatus, comprising, as a light source, the vertical cavity type semiconductor light emitting device of claim 1.

24. A vertical cavity type semiconductor light emitting device according to claim 1, wherein the first II–VI group compound semiconductor layer is an undoped layer.

25. A vertical cavity type semiconductor light emitting device, comprising:

a light emitting layer;
a current blocking layer which has an opening at a position corresponding to the inside of the light emitting layer for allowing a current to flow through the opening into the light emitting layer;
upper and lower cladding layers which are provided so as to interpose the current blocking layer therebetween; and
an upper mirror and a lower mirror which are provided so as to interpose the light emitting layer therebetween,
wherein each of the upper and the lower mirror is made of a II–VI group semiconductor, and
the current blocking layer has a refractive index smaller than a refractive index of each of the upper and lower cladding layers.

26. A light emitting apparatus, comprising the vertical cavity type semiconductor light emitting device of claim 25 and an optical detector, both of which are provided on the same substrate.

27. A light emitting apparatus comprising a plurality of the vertical cavity type semiconductor light emitting device of claim 19 which are integrally formed in an array within a single substrate.

28. An optical disk apparatus, comprising:
the vertical cavity type semiconductor light emitting device of claim 25;
light-collecting optics for collecting laser light emitted from the vertical cavity type semiconductor light emitting device onto a recording medium; and
an optical detector which receives a reflected light from the optical disk.

29. An optical disk apparatus according to claim 28, wherein an information recorded on the recording medium is read out using the laser light emitted from the vertical cavity type semiconductor light emitting device.

30. A recording apparatus, comprising, as a light source, the vertical cavity type semiconductor light emitting device of claim 25.

31. A vertical cavity type semiconductor light emitting device, comprising:
a light emitting layer made of a II–VI group compound semiconductor material;
a first undoped II–VI group compound semiconductor layer which has an opening at a position corresponding to the inside of the light emitting layer; and
an upper mirror and a lower mirror which are provided so as to interpose the light emitting layer therebetween,
wherein a current is injected through the opening into the light emitting layer.

32. A vertical cavity type semiconductor light emitting device, comprising:
a light emitting layer made of a II–VI group compound semiconductor material;
first II–VI group compound semiconductor layer which has an opening at a position corresponding to the inside of the light emitting layer; and
an upper mirror and a lower mirror which are provided so as to interpose the light emitting layer therebetween,
wherein a current is injected through the opening into the light emitting layer, and
the first II–VI group compound semiconductor layer is one of a ZnSSe layer and a ZnMgSSe layer.

* * * * *

UNITED STATES PATENT AND TRADEMARK OFFICE
CERTIFICATE OF CORRECTION

PATENT NO. : 5,956,362
DATED : September 21, 1999
INVENTOR(S) : Yokogawa et al.

It is certified that error appears in the above-identified patent and that said Letters Patent is hereby corrected as shown below:

At Column 22, line 22, "19" should read --25--.

At Column 22, line 54, before "first" insert --a--.

Signed and Sealed this

Twenty-seventh Day of February, 2001

Attest:

NICHOLAS P. GODICI

Attesting Officer     Acting Director of the United States Patent and Trademark Office

UNITED STATES PATENT AND TRADEMARK OFFICE
CERTIFICATE OF CORRECTION

PATENT NO. : 5,956,362  
DATED : September 21, 1999  
INVENTOR(S) : Yokogawa et al.

Page 1 of 1

It is certified that error appears in the above-identified patent and that said Letters Patent is hereby corrected as shown below:

Column 21,  
Line 15, delete "as la ZnTe layer, d superlattice" and insert thereto  
--as a ZnTe layer, a superlattice --.

Column 22,  
Line 22, "19" should read --25--.  
Line 54, before "first" insert --a--.

This certificate supersedes Certificate of Correction issued February 27, 2001.

Signed and Sealed this

Third Day of July, 2001

Attest:

NICHOLAS P. GODICI  
Attesting Officer
Acting Director of the United States Patent and Trademark Office